United States Patent [19]

Lim et al.

[11] Patent Number: 5,630,011
[45] Date of Patent: May 13, 1997

[54] QUANTIZATION OF HARMONIC AMPLITUDES REPRESENTING SPEECH

[75] Inventors: Jae S. Lim, Winchester; John C. Hardwick, Somerville, both of Mass.

[73] Assignee: Digital Voice Systems, Inc., Burlington, Mass.

[21] Appl. No.: 358,108

[22] Filed: Dec. 16, 1994

Related U.S. Application Data

[60] Division of Ser. No. 983,418, Nov. 30, 1992, abandoned, which is a continuation-in-part of Ser. No. 624,878, Dec. 5, 1990, Pat. No. 5,226,084.

[51] Int. Cl.$^6$ .................. G10L 3/02; G10L 9/00
[52] U.S. Cl. ........................ 395/2.14; 395/2.15
[58] Field of Search ...................... 395/2.14, 2.15

[56] References Cited

U.S. PATENT DOCUMENTS

| | | |
|---|---|---|
| 3,975,587 | 8/1976 | Dunn et al. . |
| 3,982,070 | 9/1976 | Flanagan . |
| 3,995,116 | 11/1976 | Flanagan . |
| 4,276,647 | 6/1981 | Thacker et al. . |
| 4,720,861 | 1/1988 | Bertrand . |
| 4,724,535 | 2/1988 | Ono ........................ 375/122 |
| 4,797,926 | 1/1989 | Bronson et al. . |
| 4,856,068 | 8/1989 | Quatieri et al. . |
| 4,873,689 | 10/1989 | Pellerin . |
| 4,885,790 | 12/1989 | McAulay et al. . |
| 5,023,910 | 6/1991 | Thomson . |
| 5,054,072 | 10/1991 | McAulay et al. . |
| 5,091,944 | 2/1992 | Takahashi . |
| 5,226,084 | 7/1993 | Hardwick et al. . |
| 5,265,167 | 11/1993 | Akamine et al. . |

FOREIGN PATENT DOCUMENTS

| | | | |
|---|---|---|---|
| WO911754 | 1/1991 | WIPO ........................ 2/2.14 |

OTHER PUBLICATIONS

Quatieri, et al. "Speech Transformations Based on A Sinusoidal Representation", IEEE, TASSP, vol., ASSP34 No. 6, Dec. 1986, pp. 1449–1464.

Griffin, "The Multiband Excitation Vocoder", Ph.D. Thesis, M.I.T., 1987.

Griffin, et al., "A High Quality 9.6 Kbps Speech Coding System", Proc. ICASSP 86, pp. 125–128, Tokyo, Japan, Apr. 13–20, 1986.

Griffen et al., "A New Model–Based Speech Analysis/Synthesis System", Proc. ICASSP 85 pp. 513–516, Tampa. FL., Mar. 26–29, 1985.

Hardwick, "A 4.8 kbps Multi–Band Excitation Speech Coder", S.M. Thesis, M.I.T., May 1988.

McAulay et al., "Mid–Rate Coding Based on a Sinusoidal Representation of Speech", Proc. IEEE 1985 pp. 945–948.

Hardwick et al. "A 4.8 Kbps Multi–band Excitation Speech Coder," Proceedings from ICASSP, International Conference on Acoustics, Speech and Signal Processing, New York, N.Y., Apr. 11–14, pp. 374–377 (1988).

Griffin et al., "Multiband Excitation Vocoder" IEEE Transactions on Acoustics, Speech and Signal Processing, vol. 36, No. 8, pp. 1223–1235 (1988).

Almeida et al., "Harmonic Coding: A Low Bit–Rate, Good–Quality Speech Coding Technique," IEEE (CH 1746–7/82/000 1684) pp. 1664–1667 (1982).

Tribolet et al., "Frequency Domain Coding of Speech," IEEE Transactions on Acoustics, Speech and Signal Processing, V. ASSP–27, No. 5, pp. 512–530 (Oct. 1979).

McAulay et al., "Speech Analysis/Synthesis Based on A Sinusoidal Representation," IEEE Transactions on Acoustics, Speech and Signal Processing V. 34, No. 4, pp. 744–754, (Aug. 1986).

Griffin, et al. "A New Pitch Detection Algorithm", Digital Signal Processing, No. 84, pp. 395–399.

McAulay, et al., "Computationally Efficient Sine–Wave Synthesis and Its Application to Sinusoidal Transform Coding", IEEE 1988, pp. 370–373.

Portnoff, "Short–Time Fourier Analysis of Sampled Speech," IEEE Transactions on Acoustics, Speech, and Signal Processing, vol. ASSP–29, No. 3, Jun. 1981, pp.324–333.

Griffin et al. "Signal Estimation from modified Short t–Time Fourier Transform", IEEE Transactions on Acoustics, Speech, and Signal Processing, vol. ASSP–32, No. 2, Apr. 1984, pp. 236–243.

Almeida, et al. "Variable–Frequency Suynthesis: An Improved Harmonic Coding Scheme", ICASSP 1984 pp. 27.5.1–27.5.4.

Flanagan, J.L., Speech Analysis Synthesis and Perception, Springer–Verlag, 1982, pp. 378–386.
Rowden, Chris, *Speech Processing*, 1992, McGraw–Hill Book Co., pp. 64–67.
Mouy, Benoit and La Noue, Pierre; "Voice Transmission at a Very Low Bit Rate on a Noisy Channel", IEEE, ICASSP–92, vol. 2; Mar. 1992, pp. 149–152.

*Primary Examiner*—Allen R. Macdonald
*Assistant Examiner*—Indranil Chowdhury
*Attorney, Agent, or Firm*—Fish & Richardson P.C.

[57] ABSTRACT

In a speech coding and decoding system, in which a time-wise segment of an acoustic speech signal is represented by a frame of a data signal characterized by a fundamental frequency and spectral harmonics, a current frame is reconstructed using a set of prediction signals based on the number of spectral harmonics for the current frame and a preceding frame and reconstructed signal parameters characterizing the preceding frame. The number of spectral harmonics for the current and preceding frames are reconstructed from at least a pair of digitally encoded signals that are generated using error protection codes for all of their bits.

17 Claims, 9 Drawing Sheets

QUANTIZATION OF HARMONIC AMPLITUDES REPRESENTING SPEECH

This application is a division of U.S. patent application Ser. No. 07/983,418 filed Nov. 30, 1992, now abandoned; which is a Continuation-in-part of U.S. patent application Ser. No. 07/624,878 filed Dec. 5, 1990, now U.S. Pat. No. 5,226,084 issued Jul. 6, 1993.

This invention relates in general to methods for coding speech. It relates specifically to an improved method for quantizing harmonic amplitudes of a parameter representing a segment of sampled speech.

RELATED DOCUMENTS

This is a continuation in part of copending, co-assigned U.S. patent application serial number 624,878, filed on Dec. 5, 1990, "Methods for Speech Quantization and Error Correction," now U.S. Pat. No. 5,226,084. A related PCT application also entitled "Methods for Speech Quantization and Error Correction," was filed with the United States Receiving Office on Dec. 4, 1991, with serial number PCT/US91/09135 (the "PCT Application") and was published on Jun. 25, 1992. A related application, U.S. application Ser. No. 07/983,397, filed on Nov. 30, 1992, is entitled "Digital Transmission of Acoustic Signals Over a Noisy Communication Channel". All three documents are incorporated herein by reference.

BACKGROUND

The problem of speech coding (compressing speech into a small number of bits) has a large number of applications, and as a result has received considerable attention in the literature. One class of speech coders (vocoders) which have been extensively studied and used in practice is based on an underlying model of speech. Examples from this class of coders include linear prediction vocoders, homomorphic vocoders, and channel vocoders. In these vocoders, speech is modeled on a short-time basis as the response of a linear system excited by a periodic impulse train for voiced sounds or random noise for unvoiced sounds. Speech is analyzed by first segmenting speech using a window such as a Hamming window. Then, for each segment of speech, the excitation parameters and system parameters are estimated and quantized. The excitation parameters consist of the voiced/unvoiced decision and the pitch period. The system parameters consist of the spectral envelope or the impulse response of the system. In order to reconstruct speech, the quantized excitation parameters are used to synthesize an excitation signal consisting of a periodic impulse train in voiced regions or random noise in unvoiced regions. This excitation signal is then filtered using the quantized system parameters.

Even though vocoders based on this underlying speech model have produced intelligible speech, they have not been successful in producing high quality speech. As a consequence, they have not been widely used for high quality speech coding. The poor quality of the reconstructed speech is in part due to the inaccurate estimation of the model parameters and in part due to limitations in the speech model.

Another speech model, referred to as the Multi-Band Excitation (MBE) speech model, was developed by Griffin and Lim in 1984. Speech coders based on this speech model were developed by Griffin and Lim in 1986, and they were shown to be capable of producing high quality speech at rates above 8000 bps (bits per second). Subsequent work by Hardwick and Lim produced a 4800 bps MBE speech coder, which used more sophisticated quantization techniques to achieve similar quality at 4800 bps that earlier MBE speech coders had achieved at 8000 bps.

The 4800 bps MBE speech coder used a MBE analysis/synthesis system to estimate the MBE speech model parameters and to synthesize speech from the estimated MBE speech model parameters. As shown schematically with respect to FIGS. 1A, 1B and 1C, a discrete speech signal, denoted by s (FIG. 1B), is obtained by sampling an analog (such as electromagnetic) speech signal AS (FIG. 1A). This is typically done at an 8 kHz sampling rate, although other sampling rates can easily be accommodated through a straightforward change in the various system parameters. The system divides the discrete speech signal s into small overlapping segments by multiplying s with a window (such as a Hamming Window or a Kaiser window) to obtain a windowed signal segment $s_w(n)$ (FIG. 1B) (where n is the segment index). Each speech signal segment is then transformed from the time domain to the frequency domain to generate segment frames $F_w(n)$ (FIG. 1C). Each frame is analyzed to obtain a set of MBE speech model parameters that characterize that frame. The MBE speech model parameters consist of a fundamental frequency, or equivalently, a pitch period, a set of voiced/unvoiced decisions, a set of spectral amplitudes, and optionally a set of spectral phases. These model parameters are then quantized using a fixed number of bits (for instance, digital electromagnetic signals) for each frame. The resulting bits can then be used to reconstruct the speech signal (e.g. an electromagnetic signal), by first reconstructing the MBE model parameters from the bits and then synthesizing the speech from the model parameters. A block diagram of the steps taken to code the spectral amplitudes by a typical MBE speech coder such as disclosed in U.S. Ser. No. 624,878, now U.S. Pat. No. 5,226,084, is shown in FIG. 2.

The invention described herein applies to many different speech coding methods, which include but are not limited to linear predictive speech coders, channel vocoders, homomorphic vocoders, sinusoidal transform coders, multi-band excitation speech coders and improved multiband excitation (IMBE) speech coders. For the purpose of describing this invention in detail, a 7.2 kbps IMBE speech coder is used. This coder uses the robust speech model, referred to above as the Multi-Band Excitation (MBE) speech model. Another similar speech coder has been standardized as part of the INMARSAT-M (International Marine Satellite Organization) satellite communication system.

Efficient methods for quantizing the MBE model parameters have been developed. These methods are capable of quantizing the model parameters at virtually any bit rate above 2 kbps. The representative 7.2 kbps IMBE speech coder uses a 50 Hz frame rate. Therefore 144 bits are available per frame. Of these 144 bits, 57 bits are reserved for forward error correction and synchronization. The remaining 87 bits per frame are used to quantize the MBE model parameters, which consist of a fundamental frequency $\hat{\omega}$, a set of K voiced/unvoiced decisions and a set of L spectral amplitudes $\hat{M}_l$. The values of K and L vary depending on the fundamental frequency of each frame. The 87 available bits are divided among the model parameters as shown in Table 1.

TABLE 1

| Bit allocation | |
|---|---|
| Parameter | Number of Bits |
| Fundamental Frequency | 8 |
| Voiced/Unvoiced Decision | K |
| Spectral Amplitudes | 79 − K |

Although this spectral amplitude quantization method was designed for use in an MBE speech coder the quantization techniques are equally useful in a number of different speech coding methods, such as the Sinusoidal Transform Coder and the Harmonic Coder.

As used herein, parameters designated with the hat accent (^) are the parameters as determined by the encoder, before they have been quantized or transmitted to the decoder. Parameters designated with the tilde accent (~) are the corresponding parameters, that have been reconstructed from the bits to be transmitted, either by the decoder or by the encoder as it anticipatorily mimics the decoder, as explained below. Typically, the path from coder to decoder entails quantization of the hat ^ parameter, followed by coding and transmission, followed by decoding and reconstruction. The two parameters can differ due to quantization and also due to bit errors introduced in the coding and transmission process. As explained below, in some instances, the coder uses the ~ parameters to anticipate action that the decoder will take. In such instances, the parameters used by the coder have been quantized, and reconstructed, but will not have been subject to possible bit errors.

For a particular speech segment, the fundamental frequency $\hat{\omega}$ is quantized by first converting it to its equivalent pitch period. Estimation of the fundamental frequency is described in detail in U.S. Ser. No. 624,878 and the PCT application.

The value of $\hat{\omega}$ is typically restricted to a range. $\hat{\omega}$ is quantized by converting it to a pitch period. In general, a two step estimation method is used, with an initial pitch period (which is related to the fundamental frequency by a specific function $$\hat{P} = \frac{2\pi}{\hat{\omega}}$$

estimate being restricted to a set of specified pitch periods, for instance corresponding to $$\frac{2\pi}{123.125} \leq \hat{\omega} \leq \frac{2\pi}{19.875}.$$

The parameter $\hat{P}$ is uniformly quantized using 8 bits and a step size of 0.5. This corresponds to a pitch period accuracy of one half sample. The pitch period is then refined to obtain the final estimate which has one-quarter-sample accuracy. The pitch period is quantized by finding the value:

$$\hat{b}_0 = \left\lfloor \frac{4\pi}{\hat{\omega}} - 39 \right\rfloor \tag{2}$$

The quantity $\hat{b}_0$ can be represented with eight bits using the following unsigned binary representation:

TABLE 2

| Eight Bit Binary Representation | |
|---|---|
| value | bits |
| 0 | 0000 0000 |
| 1 | 0000 0001 |
| 2 | 0000 0010 |
| . | . |
| . | . |
| 255 | 1111 1111 |

This binary representation is used throughout the encoding and decoding of the IMBE model parameters.

For a particular segment, $\hat{L}$ denotes the number of spectral amplitudes in the frequency domain transform of that segment. The value of $\hat{L}$ is derived from the fundamental frequency for that frame, $\hat{\omega}$, according to the relationship, $$\hat{L} = \left\lfloor \beta \left\lfloor \frac{\pi}{\hat{\omega}} + .25 \right\rfloor \right\rfloor \tag{2}$$

where $0 \leq \beta \leq 1.0$ determines the speech bandwidth relative to half the sampling rate. The function $\lfloor x \rfloor$, referred to in Equation (2) (a "floor" function), is equal to the largest integer less than or equal to x. The $\hat{L}$ spectral amplitudes are denoted by $\hat{M}_l$ for $1 \leq l \leq \hat{L}$ where $\hat{M}_1$ is the lowest frequency spectral amplitude and $\hat{M}_{\hat{L}}$ is the highest frequency spectral amplitude.

The fundamental frequency is generated in the decoder by decoding and reconstructing the received value, to arrive at $\tilde{b}_0$, from which $\tilde{\omega}$ can be generated according to the following:

$$\tilde{\omega} = \frac{4\pi}{\tilde{b}_0 + 39.5} \tag{3}$$

The set of windowed spectral amplitudes for the current speech segment are identified as $s_w(0)$ (with the parenthetical numeral 0 indicating the current segment, −1 indicating the preceding segment, +1 indicating the following segment, etc.) are quantized by first calculating a set of predicted spectral amplitudes based on the spectral amplitudes of the previous speech segment $s_w(-1)$. The predicted results are compared to the actual spectral amplitudes, and the difference for each spectral amplitude, termed a prediction residual, is calculated. The prediction residuals are passed to and used by the decoder.

The general method is shown schematically with reference to FIG. 2 and FIG. 3. (The process is recursive from one segment to the next, and also in some respect, between the coder and the decoder. Therefore, the explanation of the process is necessarily a bit circular, and starts midstream.) The vector $\hat{M}(0)$ is a vector of $\hat{L}$ unquantized spectral amplitudes, which define the spectral envelope of the current sampled window $s_w(0)$. For instance, as shown in FIG. 1C, $\hat{M}(0)$ is a vector of twenty-one spectral amplitudes, for the harmonic frequencies that define the shape of the spectral envelope for frame $F_w(0)$. $\hat{L}$ in this case is twenty-one. $\hat{M}_1(0)$ represents the $1^{th}$ element in the vector, $1 \leq l \leq \hat{L}$.

In general, the method includes coding steps 202 (FIG. 2), which take place in a coder, and decoding steps 302 (FIG. 3), which take place in a separate decoder. The coding steps include the steps discussed above, not shown in FIG. 2: i.e., sampling the analog signal AS; applying a window to the sampled signal AS, to establish a segment $s_w(n)$ of sampled speech; transforming the sampled segment $s_w(n)$ from the time domain into a frame $F_w(n)$ in the frequency domain; and identifying the MBE speech model parameters that define that segment, i.e.: fundamental frequency $\hat{\omega}$; spectral amplitudes $\hat{M}(0)$ (also known as samples of the spectral envelope); and voiced/unvoiced decisions. These parameters are used as inputs to conduct the additional coding steps shown in FIG. 2. (The fundamental frequency in the cited literature is often specified with the subscript 0 as $\hat{\omega}_0$, to distiguish the fundamental from the harmonic frequencies. However, in the following, the subscript is not used, for typographical clarity. No confusion is caused, because the harmonic frequencies are not referred to with the variable $\omega$.)

The method uses post transmission prediction in the decoding steps conducted by the decoder as well as differential coding. A packet of data is sent from the coder to the decoder representing model parameters of each spectral segment. However, for some of the parameters, such as the spectral amplitudes, the coder does not transmit codes representing the actual full value of the parameter (except for the first frame). This is because the decoder makes a rough prediction of what the parameter will be for the current frame, based on what the decoder determined the parameter to be for the previous frame (based in turn on a combination of what the decoder previously received, and what it had determined for the frame preceding the preceding segment, and so on). Thus, the coder only codes and sends the difference between what the decoder will predict and the actual values. These differences are referred to as "prediction residuals." This vector of differences will, in general, require fewer bits for coding than would the coding of the absolute parameters.

The values that the decoder generates as output from summation 316 are the logarithm base 2 of what are referred to as the quantized spectral amplitudes, designated by the vector $\tilde{M}$. This is distinguished from the vector of unquantized values $\hat{M}$, which is the input to $\log_2$ block 204 in the coder. (The prediction steps are grouped in the dashed box 340.) To compute the vector of spectral log amplitudes $\log_2 \tilde{M}(0)$ for the current frame, the decoder stores the vector $\log_2 \tilde{M}(-1)$ for the previous segment by taking a frame delay 312. At 314, the decoder computes the predicted spectral log amplitudes $\check{M}$ according to a method discussed below. It uses as inputs, the vector $\log_2 \tilde{M}(-1)$ and the reconstructed fundamental frequencies for the previous segment $\omega(-1)$ and for the current segment $\omega(0)$, which have been received and decoded by the decoder before decoding of the spectral log amplitudes.

These predicted values for the spectral log amplitudes are added at 316, with the decoded differential prediction residuals, that have been transmitted by the coder. The steps of reconstruction 318, reverse DCT transform 320 and reformation into six blocks 322 are explained below. It is only necessary to know that they decode a received vector $\hat{b}$ that the coder has generated, coding for the differences between, on the one hand, the actual values for $\log_2 \hat{M}(0)$ that must ultimately be recreated by the decoder and, on the other hand, the values $\check{M}$ that the coder has calculated will be predicted by the decoder in step 314. Because the coder cannot communicate with the decoder, to anticipate the prediction $\check{M}$ to be made by the decoder, the coder must also make the prediction, as closely as possible to the manner in which the decoder will make the prediction. The prediction $\check{M}$ in the decoder is based on the values $\log_2 \tilde{M}(-1)$ for the previous segment generated by the decoder.

Therefore, the coder must also generate these values, as if it were the decoder, as discussed below, so that it anticipatorily mirrors the steps that will be taken by the decoder.

Thus, if the coder accurately anticipates the prediction $\check{M}$ that the decoder will make with respect to the spectral log amplitudes $\log_2 \hat{M}(0)$, the values $\hat{b}$ to be transmitted by the encoder will reflect the difference between the prediction $\check{M}$ and the actual values $\log_2 \hat{M}(0)$. In the decoder, at 316, upon addition, the result is $\log_2 \tilde{M}(0)$ a quantized version of the actual values $\log_2 \hat{M}(0)$.

The coder, during the simulation of the decoder steps at 240, conducts steps that correspond to the steps that will be performed by the decoder, in order for the coder to anticipatorily mirror how the decoder will predict the values for $\log_2 \tilde{M}(0)$ based on the previous computed values $\log_2 \tilde{M}(-1)$. In other words, the coder conducts steps 240 that mimic the steps conducted by the decoder. The coder has previously produced the actual values $\hat{M}(0)$. The logarithm base two of this vector is taken at 204. At 216, the coder subtracts from this logarithm vector, a vector of the predicted spectral log amplitudes $\check{M}$, calculated at step 214. The coder uses the same steps for computing the predicted values $\check{M}$ as will the decoder, and uses the same inputs as will the decoder, $\omega(0)$, $\omega(-1)$, which are the reconstructed fundamental frequencies and $\log_2 \tilde{M}(-1)$. It will be recalled, that $\log_2 \tilde{M}(-1)$ is the value that the decoder has computed for the previous frame (after the decoder has performed its rough prediction and then adjusted the prediction with addition of the prediction residual values transmitted by the coder).

Thus, the coder generates $\log_2 \tilde{M}(-1)$ by performing the exact steps that the decoder performed to generate $\log_2 \tilde{M}(-1)$. With respect to the previous segment, the coder had sent to the decoder, a vector $\hat{b}_1(-1)$ where $2 \leq 1 \leq \hat{L}+3$. (The generation of the vector $\hat{b}_1$ is discussed below.) Thus, to recreate the steps that the decoder will perform, at 218, the coder reconstructs the values of the vector $\hat{b}_1(-1)$ into DCT coefficients as the decoder will do. An inverse DCT transform (or inverse of whatever suitable transform is used in the forward transformation part of the coder at step 206) is performed at 220, and reformation into blocks is conducted at 222. At this point, the coder will have produced the same vector as the decoder produces at the output of reformation step 322. At 226, this is added to the predicted spectral log amplitudes for the previous frame $F_w(-2)$, to arrive at the output from decoder $\log_2 \tilde{M}(-1)$. The result of the summation in the coder at 226, $\log_2 \tilde{M}(-1)$, is stored by implementing a frame delay 212, after which it is used as discussed above to simulate the decoder's prediction of $\log_2 \tilde{M}(0)$.

The vector $\hat{b}_1$ is generated in the coder as follows. At 216, the coder subtracts the vector $\check{M}$ that the coder calculates the decoder will predict, from the actual values of $\log_2 \hat{M}(0)$ to produce a vector $\hat{T}$. At 210, this vector is divided into blocks, for instance six, and at 206 a transform, such as a DCT is performed. Other sorts of transforms, such as Discrete Fourier, may also be used. The output of the DCT transform is organized in two groups: a set of D.C. values, associated into a vector referred to as the Prediction Residual Block Average (PRBA); and the remaining, higher order coefficients, both of which are quantized at 208 and are designated as the vector $\hat{b}_1$.

These values are sent to the decoder, and are also used in the steps 240 to simulate the decoder mentioned above, to simulate how the decoder will predict the vector $\check{M}$ for the current segment.

Special considerations are taken with respect to the first segment, since the decoder will not have at its disposal a preceding segment to use in its predictions.

The foregoing method, of coding and decoding using predicted values and transmitted prediction residuals, is dicussed fully in the PCT patent application and U.S. Ser. No. 624,878, now U.S. Pat. No. 5,226,084.

This quantization method provides very good fidelity using a small number of bits and it maintains this fidelity as $\hat{L}$ varies over its range. The computational requirements of this approach are well within the limits required for real-time implementation using a single DSP such as the DSP32C available from AT & T. This quantization method separates the spectral amplitudes into a few components, such as the mean of the PRBA vector, that are sensitive to bit errors and a large number of other components that are not very sensitive to bit errors. Forward error correction can then be used in an efficient manner by providing a high degree of protection for the few sensitive components and a lesser degree of protection for the remaining components.

Turning now to a rudimentary known method by which the decoder predicts at 314 the values for the spectral amplitudes of the current segment, based on the spectral amplitudes of the previous segment, as has been mentioned, $\hat{L}(0)$ denotes the number of spectral amplitudes in the current speech segment and $\hat{L}(-1)$ denotes the number of spectral amplitudes in the previous speech segment. A rudimentary method for generating the prediction residuals, $\hat{T}_1$ for $1 \leq 1 \leq \hat{L}(0)$ is given by, $$\hat{T}_1 = \begin{cases} \log_2 \hat{M}_1(0) - \gamma \log_2 \tilde{M}_1(-1) & \text{if } 1 \leq \hat{L}(-1) \\ \log_2 \hat{M}_1(0) - \gamma \log_2 \tilde{M}_{\hat{L}}(-1) & \text{otherwise} \end{cases} \quad (4)$$

where $\hat{M}_1(0)$ denotes the spectral amplitudes of the current speech segment and $\tilde{M}_1(-1)$ denotes the quantized spectral amplitudes of the previous speech segment. The constant $\gamma$, a decay factor, is typically equal to 0.7, however any value in the range $0 \leq \gamma \leq 1$ can be used. The effect and purpose of the constant $\gamma$ are explained below.

For instance, as shown in FIG. 1c, $\hat{L}(0)$ is 21 and $\hat{L}(-1)$ is 7. The fundamental frequency $\omega(0)$ of the current frame $F_w(0)$ is $3\alpha$ and the fundamental frequency $\omega(-1)$ of the previous frame $F_w(-1)$ is $\alpha$. It has been determined that it is often the case that the shape of the spectral envelope curve h for adjacent segments of speech is rather similar. As can be seen from FIG. 1C, the shape of the spectral envelope in the previous frame and the current frame (i.e., the shape of curves h(0) and h(-1)) is rather similar. The fundamental frequency of each segment can differ significantly while the envelope shape remains similar.

From inspection of equation 4, it can be seen that this method works well if $\omega(0)$ and $\omega(-1)$ are relatively close to each other, however, if they differ significantly, the prediction can be quite inaccurate. Each harmonic amplitude can be identified by an index number representing its position along the frequency axis. For instance, for the example set forth above, according to the rudimentary method, the value for the first of the harmonic amplitudes in the current frame, would be predicted to be equal to the value of the first harmonic amplitude in the previous frame. Similarly, the value of the fourth harmonic amplitude would be predicted to be equal to the value of the fourth harmonic amplitude in the previous frame. This, despite the fact that the fourth harmonic amplitude in the current frame is closer in value to an interpolation between the amplitudes of the first and second harmonics of the previous frame, rather than to the value of the fourth harmonic. Further, the eighth through twenty-first harmonic amplitudes of the current frame would all have the value of the last $\hat{L}(-1)$ or seventh harmonic amplitude of the previous frame.

This rudimentary method does not account for any change in the fundamental frequency $\omega$ between the previous segment and current frame. In order to account for the change in the fundamental frequency, the PCT application, and U.S. Ser. No. 624,878 (now U.S. Pat. No. 5,226,084) disclose a method that first interpolates a spectral amplitude of the previous segment that may fall between harmonics. For instance, the frequency ⅓ of the way between the second and the third harmonics of the previous frame is interpolated. This is typically done using linear interpolation, however various other forms of interpolation could also be used. Then the interpolated spectral amplitudes of the previous frame are resampled at the frequency points corresponding to the harmonic in question of the current frame. This combination of interpolation and resampling produces a set of predicted spectral amplitudes, which have been corrected for any inter-frame change in the fundamental frequency.

It is helpful to define a value relative to the 1th index of the current frame:

$$k_1 = \frac{\tilde{\omega}(0)}{\tilde{\omega}(-1)} \cdot 1 \quad (5)$$

Thus, $k_1$ represents a relative index number. If the ratio of the current to the previous fundamental frequencies is ⅓, as in the example, $k_1$ is equal to ⅓·1, for each index number 1.

If linear interpolation is used to compute the predicted spectral log amplitudes, then a predicted spectral log amplitude $\tilde{M}$ for the 1th harmonic of the current frame can be expressed as:

$$\tilde{M}_1 = \gamma \left[ \overbrace{(1 + \lfloor k_1 \rfloor - k_1) \log_2 \tilde{M}_{\lfloor k_1 \rfloor}(-1)}^{a \quad\quad b} + \overbrace{(k_1 - \lfloor k_1 \rfloor) \log_2 \tilde{M}_{\lfloor k_1 \rfloor + 1}(-1)}^{c \quad\quad d} \right] \quad (6)$$

where $\gamma$ is as above.

Thus, the predicted value is interpolated between two actual values of the previous frame. For instance, the predicted value for the seventh harmonic amplitude (1=7) is equal to ⅔ (the term in bracket a) the log of the second amplitude of the prior frame (term in bracket b) plus ⅓ (term in bracket c) the log of the third amplitude of the prior frame (term in bracket d). Thus, the predicted value is a sort of weighted average between the two harmonic amplitudes of the previous frame closest in frequency to the harmonic amplitude in question of the current frame Thus, this value $\tilde{M}_1$ is the value that the decoder will predict for the log amplitude of the harmonic frequencies that define the spectral envelope for the current frame. The coder also generates this prediction value in anticipation of the decoder's prediction, and then calculates a prediction residual vector, $\hat{T}_1$, essentially equal to the difference between the actual value the coder has generated and the predicted value that the coder has calculated that the decoder will generate:

$$\hat{T}_1 = \log_2 \hat{M}_1(0) - \tilde{M}_1 \quad (7)$$

It is disclosed in U.S. Ser. No. 624,878 that $\gamma$, which is incorporated into $\tilde{M}_1$, can be adaptively changed from frame to frame in order to improve performance.

If the current and previous fundamental frequencies are the same, the improved method results are identical to the rudimentary method. In other cases the improved method produces a prediction residual with lower variance than the former method. This allows the prediction residuals to be quantized with less distortion for a given number of bits.

Turning now to an explanation of the purpose for the factor $\gamma$, as has been mentioned, the coder does not transmit absolute values from the coder to the decoder. Rather, the coder transmits a differential value, calculated to be the difference between the current value, and a prediction of the current value made on the basis of previous values. The differential value that is received by the decoder can be erroneous, either due to computation errors or bit transmission errors. If so, the error will be incorporated into the current reconstructed frame, and will further be perpetuated into subsequent frames, since the decoder makes a prediction for the next frame based on the previous frame. Thus, the erroneous prediction will be used as a basis for the reconstruction of the next segment.

The encoder does include a mirror, or duplicate of the portion of the decoder that makes the prediction. However, the inputs to the duplicate are not values that may have been corrupted during transmission, since such errors arise unexpectedly in transmission and cannot be duplicated. Therefore, differences can arise between the predictions made by the decoder, and the mirroring predictions made in the encoder. These differences detract from the quality of the coding scheme.

Thus, the factor $\gamma$ causes any such error to "decay" away after a number of future segments, so that any errors are not perpetuated indefinitely. This is shown schematically in FIG. 4. Sub panels A and B of FIG. 4 show the effect of a transmitted error with no factor $\gamma$ (which is the same as $\gamma$ equal to 1). The amplitude of a single spectral harmonic is shown for the current frame x(0), and the five preceding frames x(−1), x(−2), etc. The vertical axis represents amplitude and the horizontal axis represents time. The values sent $\delta(n)$ are indicated below the amplitude which is recreated from the differential value being added to the previous value. (This example does not exactly follow the method under discussion, since it does not include any prediction, or interpolation, for simplicity. It is merely designed to show how an error is perpetuated in a differential coding scheme, and how the factor $\gamma$ can be used to reduce the error over time.) The original values are represented as points and the reconstructed values are represented as boxes. For instance, $\delta(-4)$ equals 10, the difference x(−4) minus x(−5). Similarly, $\delta(-2)$ equals −20, the difference x(−2) minus x(−3). The reconstructions are according to the formula:

$$\tilde{x}(n)=\tilde{x}(n-1)+\delta(n). \quad (8)$$

Panel A shows the situation if the correct $\delta$ values are sent. The reconstructed values equal the original values.

Panel B shows the situation if an incorrect value is transmitted, for instance $\delta(-2)$ equals +40 rather than +10. The reconstructed value for x(−3) equals 50, rather than 20, and all of the subsequent values, which are based on x(−3), are offset by 30 from the correct original. The error perpetuates in time.

Panel C shows the situation if a factor $\gamma$ is used. The differential that will be sent is no longer the simple difference, but rather:

$$\delta(n)=x(n)-\gamma\cdot(x(n-1)). \quad (9)$$

Consequently, the reconstructions are according to the following formula:

$$\tilde{x}(n)=\gamma\cdot\tilde{x}(n-1)+\delta(n). \quad (10)$$

Thus, $\delta(-3)$ equals +12.5, etc. If no error corrupts the values sent, the reconstructed values (boxes) are the same as the original, as shown in panel C. However, if an error, such as a bit error corrupts the differential values sent, such as sending $\delta(-3)$ equals +40 rather than +12.5, the effect of the error is minimized, and decays with time. The errant value is reconstructed as 47.5 rather than the 50 that would be the case with no decay factor. The next value, which should be zero, is reconstructed as 20.63, rather than as 30 in the case where no $\gamma$ decay factor is used. The next value, also properly equal to zero, is reconstructed as 15.47, which, although incorrect, is closer to being correct than the 30 that would again be calculated without the decay factor. The next calculated value is even closer to being correct, and so on.

The decay factor can be any number between zero and one. If a smaller factor, such as 0.5 is used, the error will decay away faster. However, less of a coding advantage will be gained from the differential coding, because the differential is necessarily increased. The reason for using differential coding is to obtain an advantage when the frame-to-frame difference, as compared to the absolute value, is small. In such a case, there is a significant coding advantage for differential coding. Decreasing the value of the decay factor increases the differences between the predicted and the actual values, which means more bits must be used to achieve the same quantization accuracy.

Returning to a discussion of the coding process, the prediction residuals $\hat{T}_1$ are divided into blocks. A preferred method for dividing the residuals into blocks and then generating DCT coefficients is disclosed fully in U.S. Ser. No. 624,878 (now U.S. Pat. No. 5,226,084) and the PCT application.

Once each DCT coefficient has been quantized using the number of bits specified by a bit allocation rule, the binary representation can be transmitted, stored, etc., depending on the application. The spectral log amplitudes can be reconstructed from the binary representation by first reconstructing the quantized DCT coefficients for each block, performing the inverse DCT on each block, and then combining with the quantized spectral log amplitudes of the previous segment using the inverse of Equation (7).

Since bit errors exist in many speech coder applications, a robust speech coder must be able to correct, detect and/or tolerate bit errors. One technique which has been found to be very successful is to use error correction codes in the binary representation of the model parameters.

Error correction codes allow infrequent bit errors to be corrected, and they allow the system to estimate the error rate. The estimate of the error rate can then be used to adaptively process the model parameters to reduce the effect of any remaining bit errors.

According to a representative error correction and protection method, the quantized speech model parameter bits are divided into three or more different groups according to their sensitivity to bit errors, and then different error correction or detection codes are used for each group. Typically the group of data bits which is determined to be most sensitive to bit errors is protected using very effective error correction codes. Less effective error correction or detection codes, which require fewer additional bits, are used to protect the less sensitive data bits. This method allows the amount of error correction or detection given to each group to be matched to its sensitivity to bit errors. The degradation caused by bit errors is relatively low, as is the number of bits required for forward error correction.

The particular choice of error correction or detection codes which is used depends upon the bit error statistics of the transmssion or storage medium and the desired bit rate. The most sensitive group of bits is typically protected with an effective error correction code such as a Hamming code, a BCH code, a Golay code or a Reed-Solomon code.

Less sensitive groups of data bits may use these codes or an error detection code. Finally the least sensitive groups may use error correction or detection codes or they, may not use any form of error correction or detection. The error correction and detection codes used herein are well suited to a 6.4 kbps IMBE speech coder for satellite communications.

In the representative speech coder, (and also in the coder that was standardized for the INMARSATM satellite communication system), the bits per frame which are reserved for forward error correction are divided among [23,12] Golay codes which can correct up to 3 errors, [15,11] Hamming codes which can correct single errors and parity bits. The six most significant bits from the fundamental frequency ω and the three most significant bits from the mean of the PRBA vector are first combined with three parity check bits and then encoded in a [23,12] Golay code. Thus, all of the six most significant bits are protected against bit errors. A second Golay code is used to encode the three most significant bits from the PRBA vector and the nine most sensitive bits from the higher order DCT coefficients. All of the remaining bits except the seven least sensitive bits are then encoded into five [15,11] Hamming codes. The seven least significant bits are not protected with error correction codes.

At the decoder the received bits are passed through Golay and Hamming decoders, which attempt to remove any bit errors from the data bits. The three parity check bits are checked and if no uncorrectable bit errors are detected then the received bits are used to reconstruct the MBE model parameters for the current frame. Otherwise if an uncorrectable bit error is detected then the received bits for the current frame are ignored and the model parameters from the previous frame are repeated for the current frame. Techniques for addressing these bit error problems are discussed fully in U.S. Ser. No. 624,878 (now U.S. Pat. No. 5,226,084) and the PCT application.

The method described in the U.S. Ser. No. 624,878 (now U.S. Pat. No. 5,226,084) and the PCT application provide good results. However, improvements are desirable in efficiency and resistance to bit errors (robustness). For instance, the decoder and coder use as an input for making their predictions of spectral log amplitudes, the value ω. However, according to an efficient error correction method, not all of the bits of ω are protected. As mentioned above, only the six most significant bits are protected. Errors in the unprotected bits can result in significant errors in the predicted spectral log amplitudes, generated by the decoder, particularly for higher harmonics. However, these errors do not arise in the encoder. Thus, a difference arises between the predictions that the coder makes and the predictions that the decoder makes. This causes a degradation of the reconstructed signal. It is desireable to avoid this signal degradation.

It has also been determined that use of a constant value for the decay factor γ has drawbacks. In frames having relatively few harmonic amplitudes i.e. $\hat{L}$ is rather small, it is not so important to save bits by using a highly differential form of parameter coding. This is because enough bits are available to specify the parameter more closely to its actual value. A fixed number of bits are available to specify a relatively small number of harmonic amplitudes, as compared to the maximum number of harmonic amplitudes that must on some occassions be specified by the same fixed number of bits. Although it has been stated in the PCT application that the decay factor γ can be adaptively changed from segment to segment in order to improve performance, known methods have not proposed any such method by which performance can actually be improved.

Another drawback to methods such as are described above, is that the spectral envelope shape of timewise adjacent windowed frames typically bear many similarities and some differences. The method discussed in U.S. Ser. No. 624,878 (now U.S. Pat. No. 5,226,084) takes advantage of the similarities, to enable the decoder to predict the spectral envelope for the current frame. However, the differences between adjacent frames can minimize the beneficial effects, particularly due to the differential form of the known method. The principal similarity between adjacent frames is the shape of the curve h that connects each successive spectral amplitude $\hat{M}_l(n), \hat{M}_{l+1}(n), \hat{M}_{l+2}(n)$, etc. Thus, from one frame to the next, the shape of this curve is relatively similar. However, what is often different from one frame to the next, is the average value of the harmonic amplitudes. In other words, the curves, although of similar shapes, are displaced different distances from the origin.

Because the known method uses the previous frame to predict the current frame (which is essentially a differential sort of prediction), the predictions for the current frame will be based on the general location of the curve, or the distance from the origin. Since the current frame does not necessarily share the general location of the curve with its predecessor, the difference between the prediction and the actual value for the spectral amplitudes of the current frame can be quite large. Further, because the system is basically a differential coding system, as explained above, differential errors take a relatively long time to decay away. Since, it is an object of the prediction method to minimize the prediction residuals this effect is undesireable.

OBJECTS OF THE INVENTION

Thus, it is an object of the invention to produce speech using a coder and a decoder, where the decoder makes predictions as to the amplitudes of the spectral harmonics for a current frame based on the amplitudes of the spectral harmonics for the previous frame, where the steps taken to predict the amplitudes are based on parameters that are highly protected against bit errors. It is a further object of the invention to encode the spectral amplitudes using a high degree of differential coding that predicts current spectral amplitude values from previous spectral amplitude values in situations where the number of spectral amplitudes required to be encoded is high. At the same time, it is an object to reduce the degree of differential coding if the number of spectral amplitudes required to be encoded is relatively low to cause bit errors to decay away more quickly. It is also an object of the invention to use a differential coding method that takes advantage of similarities in the shape of the spectral amplitude envelope between the current frame and the preceding frame and that robustly resists transmission errors related to the average value of the spectral amplitudes between the current frame and the previous frame.

SUMMARY

The invention is for use with either the decoding portion or the encoding portion of a speech coding and decoding pair of apparati. The coder/decoder are operated according to a method by which a timewise segment of an acoustic speech signal is represented by a frame of a data signal characterized at least in part by a fundamental frequency and a plurality of spectral harmonics. The current frame is reconstructed by the decoding apparatus, which reconstructs signal parameters characterizing a frame, using a set of prediction signals. The prediction signals are based on: reconstructed signal parameters characterizing the preceding frame and a pair of control parameters that specify the number of spectral harmonics for the current frame (a second control parameter) and the preceding frame (a second control parameter).

One aspect of the invention is a method of generating the prediction signals. The parameters upon which the prediction is based are reconstructed from digitally encoded signals that have been generated using error protection for all of the digital bits used to encode each of the spectral harmonic parameters. For instance, the control parameter can be the number of spectral harmonics in the frame, derived from the six most significant bits of the fundamental frequency.

Another aspect of the invention is the method of generating a coded signal representing the spectral harmonics, using the method of generating prediction signals based on control parameters that are highly protected against bit errors. Yet another aspect of the invention is an apparatus for generating prediction signals, including means for performing the steps mentioned above.

Yet another aspect of the invention is a method for generating such prediction signals, further including the step of scaling the amplitudes of each of the set of prediction signals by a factor that is a function of the number of spectral harmonics for the current frame, having at least one domain interval that is an increasing function of the number of spectral harmonics. This aspect of the invention has the advantage that bit errors introduced into the spectral amplitudes as transmitted decay away over time. Further, for speech segments where extra bits are available the effect of bit errors decays away more quickly with no loss in coding efficiency.

Another aspect of the invention is the method of generating a coded signal representing the spectral harmonics, using the method of generating prediction signals where bit errors decay away over time, more quickly where extra bits are available. Yet another aspect of the invention is an apparatus for generating prediction signals, including means for providing for the decay of bit errors mentioned above.

Yet another aspect of the invention is a method for generating such prediction signals, further including the step of reducing the amplitudes of each of the set of predictions by the average amplitude of all of the prediction signals, averaged over the current frame. This aspect of the invention has the advantage that the effect of bit errors related to the average value of the spectral amplitudes for a particular frame introduced into the prediction signals are limited to the reconstruction of only one frame.

Another aspect of the invention is the method of generating a coded signal representing the spectral harmonics, using the method of generating prediction signals where bit errors related to the average value of the spectral amplitudes for a particular frame introduced into the prediction signals are limited to the reconstruction of only one frame. Yet another aspect of the invention is an apparatus for generating prediction signals, including means for protecting against the persistance of bit errors related to the average value of the spectral amplitudes for a particular frame.

BRIEF DESCRIPTION OF THE DRAWINGS

These and other features, aspects, and advantages of the present invention will become better understood with regard to the following description, appended claims and accompanying drawings, where:

DETAILED DESCRIPTION

Figure 2:
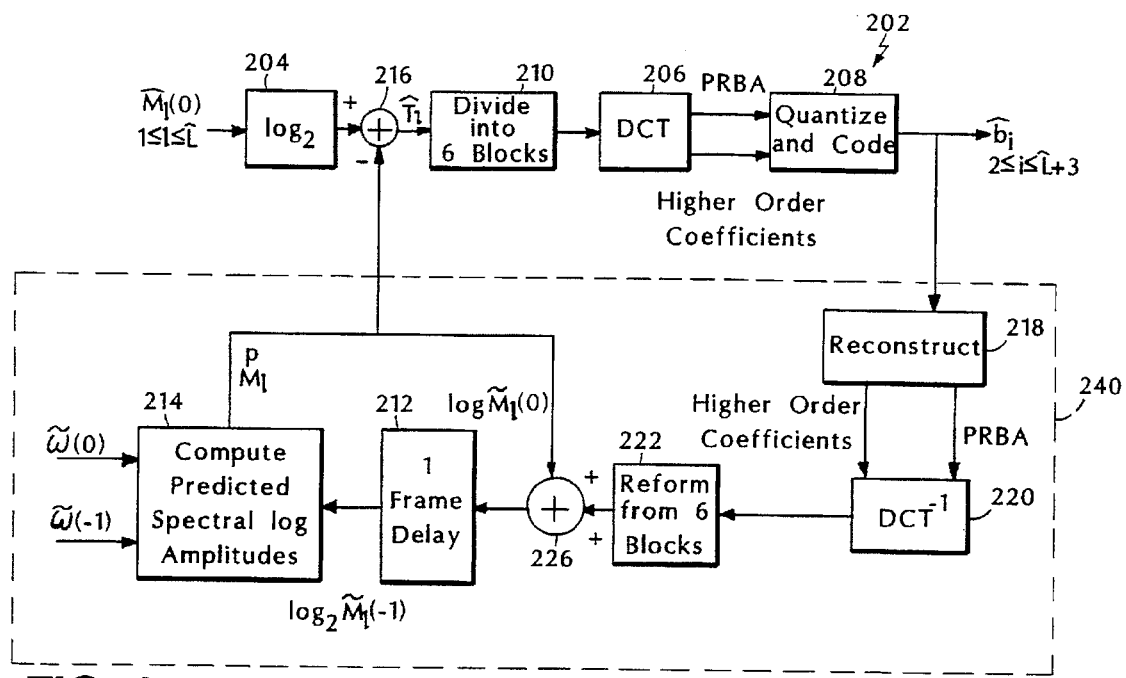
FIG. 2 is a flow chart showing the steps that are taken to encode spectral amplitudes according to a method that uses prediction of spectral amplitudes in the decoder, along with the transmission of prediction residuals by the encoder.
Figure 3:
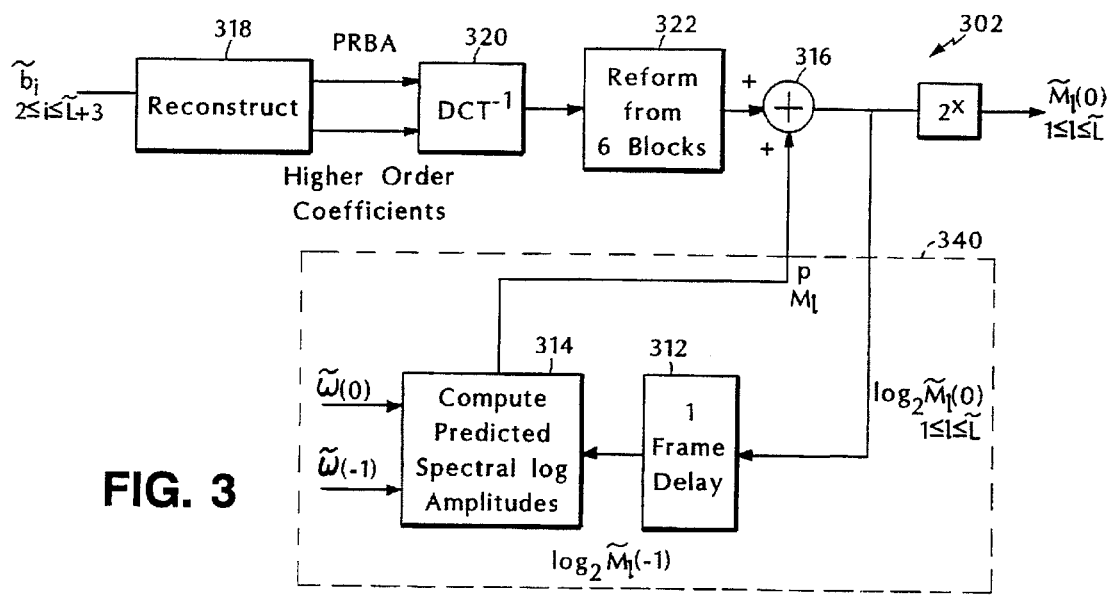
FIG. 3 is a flow chart showing the steps that are taken to decode spectral amplitudes encoded according to the method shown in FIG. 2.
Figures 4A, 4B:
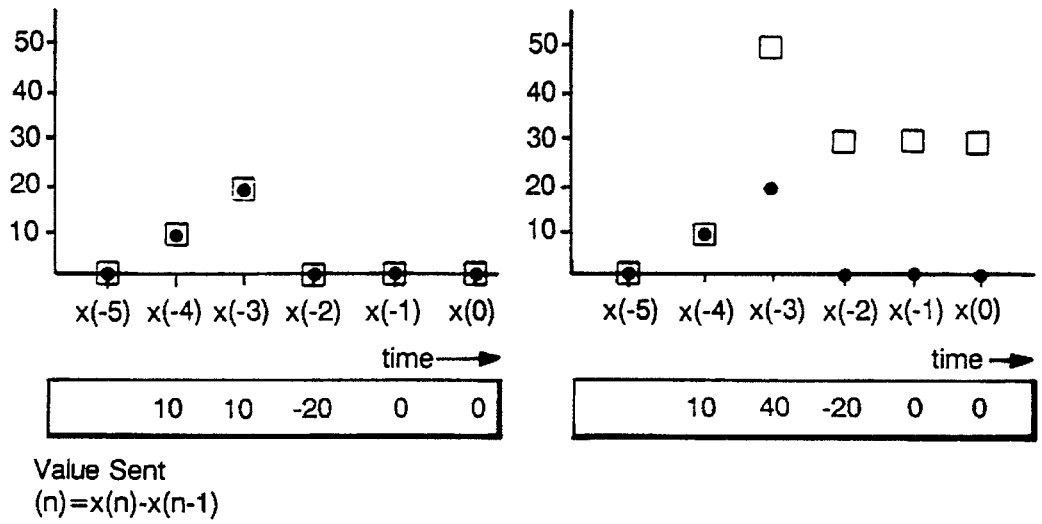
FIG. 4 is a schematic representation showing the effect of a method to minimize over time the effects of bit errors in a differential coding system.
Figures 4C, 4D:
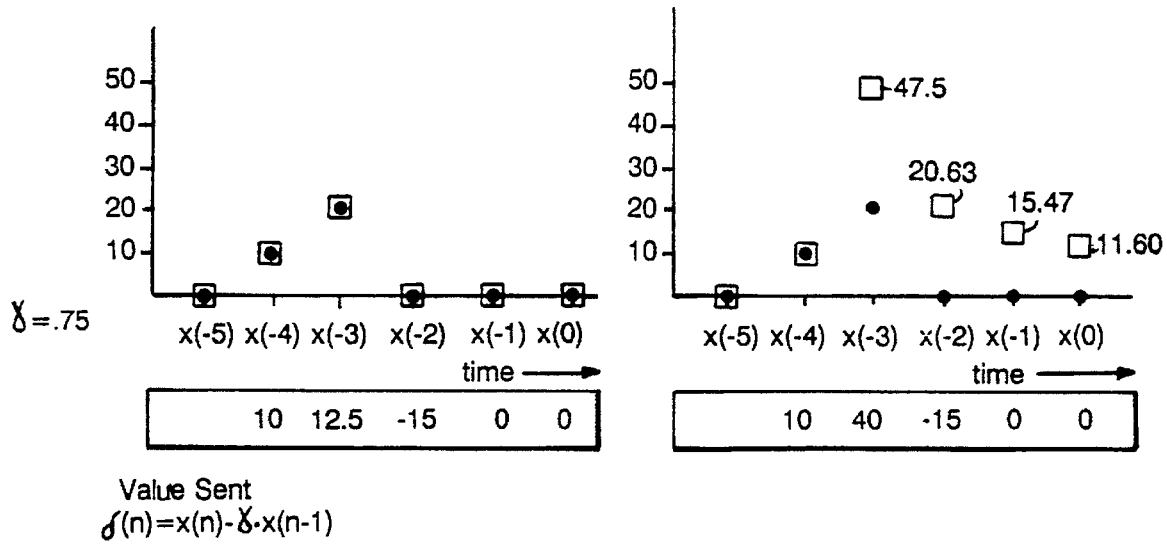

The present invention provides improved methods of predicting the spectral amplitudes $\hat{M}(0)$. These prediction method steps are conducted as part of the decoding steps, shown in FIG. 3, for instance as part of step 314. Because the coder also mirrors the decoder and conducts some of the same steps, the prediction method steps of the invention will also be conducted as part of the coding steps, for instance at step 214 shown in FIG. 2.

Figure 10A:
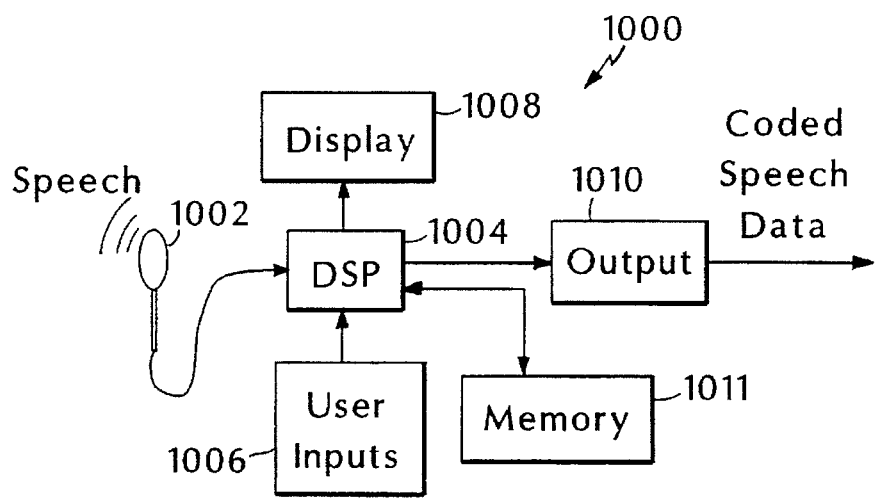
FIG. 10A is a schematic block diagram showing an embodiment of the coding apparatus of the invention.

A representative version of the coding apparatus 1000 of the invention is shown schematically by FIG. 10A. A speech signal is received by an input device 1002 such as a microphone, which is connected as an input device to a digital signal processor under appropriate computer instruction control, such as the DSP32C available from AT & T. The DSP 1004 conducts all of the data processing steps specified in the discussion of the method of the invention below. In general, it digitizes the speech signal and codes it for transmission or other treatment in a compact form. Rather than a DSP, a suitably programmed general purpose computer can be used, although such computing power is not necessary, and the additional elements of such a computer typically result in lower performance than with a DSP. An input device 1006, such as a keypad allows the user to control the operation of the DSP 1004, such as initiate receipt of a signal, processing of the signal, and designating the output of the signal. It may also be used to vary certain user variable parameters, if such is desired. A display 1008 provides the user with information about the status of the signal processing and may provide visual confirmation of the commands entered by input device 1006. An output device 1010 directs the coded speech data signal as desired, typically to a communication channel, such as a radio frequency channel, telephone line, etc. Alternatively, the coded speech data signal can be stored in memory device 1011 for later transmission or other treatment.

Figure 10B:
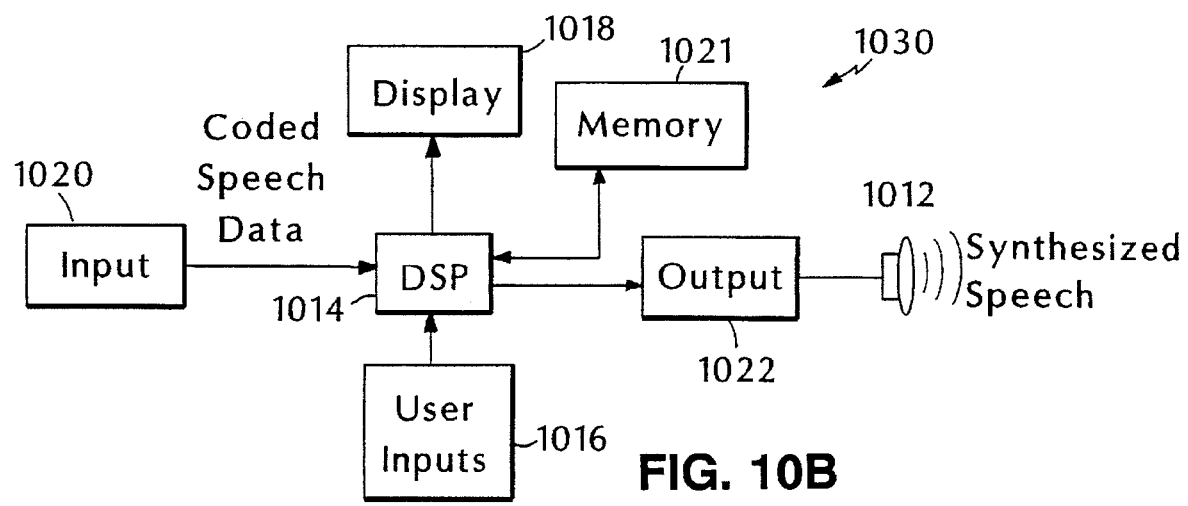
FIG. 10B is a schematic block diagram showing an embodiment of the decoding apparatus of the invention.

A representative version of the decoding apparatus 1030 of the invention is shown schematically by FIG. 10B. The coded speech data is provided by input device 1020, typically a receiver, which receives the data from a data communication channel. Alternatively, the coded speech data can be accessed from memory device 1021. DSP 1014, which can be identical to DSP 1004, is programmed according to the method steps of the invention discussed below, to decode the incoming speech data signal, and to generate a synthesized digital speech signal, which is provided to output controller 1022. A display 1018, such as a liquid crystal display, may be provided to display to the user the status of the operation of the DSP 1014, and also to provide the user with confirmation of any commands the user may have specified through input device 1016, again, typically a keypad. The synthesized speech signal may be placed into memory 1021 (although this is typically not done, after the coded speech data has been decoded) or it may be provided to a reproduction device, such as loudspeaker 1012. The output of the loudspeaker is an acoustic signal of synthesized speech, corresponding to the speech provided to microphone 1002.

Turning now to the method of the invention, in a first aspect, the prediction steps performed in the digital signal processors 1004 and 1014 of the coder 1000 and the decoder 1030 do not use as inputs the transmitted and reconstructed fundamental frequencies $\omega(0)$ and $\omega(-1)$ as is done in the method discussed in U.S. Ser. No. 624,878 (now U.S. Pat. No. 5,226,084) and the PCT application. This is because, as mentioned above, according to the error protection and detection scheme used, the fundamental frequencies $\omega$ are specified using eight bits. However, only the most significant six bits are absolutely protected by virtue of the error protection method. Therefore, undetected, uncorrected errors can be present in the fundamental frequencies as reconstructed by the decoder. The errors that may arise in the two least significant bits can create a large difference in the identification of higher harmonic spectral locations, and thus their amplitudes.

Rather than using the fundamental frequencies $\omega$, the method of the invention uses, as an input to the steps 214 and 314 of predicting the spectral log amplitudes the number of spectral harmonics, $\tilde{L}(0)$ and $\tilde{L}(-1)$. These parameters are well protected according to the error correction method discussed above because they can be specified using only the six most significant bits of the respective fundamental frequency $\omega$. Another, and preferred method of error correction and protection is discussed in the co-filed application identified above, in the names of the inventors hereof, filed of even date hereof, entitled "Digital Transmission of Acoustic Signals Over a Noisy Communication Channel" as well as a paper entitled "APCO/NASTD/Fed Project 25 Vocoder Description," Version 1.0, both of which are incorporated herein by reference. According to these methods, except when there are very large number of bit errors, $\hat{L}(0)=\tilde{L}(0)$ and $\hat{L}(-1)=\tilde{L}(-1)$. More importantly, except where there are a very large number of bit errors, the reconstructed versions, i.e. $\hat{L}(0)$ and $\tilde{L}(-1)$, as reconstructed on the one hand by the decoding steps in the decoder and on the other hand by the coding steps in the coder will be the same, with no corruption due to bit errors. An aspect of the invention is the realization that the number of spectral amplitudes $\tilde{L}(0)$ and $\tilde{L}(-1)$ can be used to generated the indices used in the interpolation step of the prediction method. Another aspect of the invention is the realization that these parameters can be derived from the highly protected most significant six bits specifying the fundamental frequency.

Figure 11A:
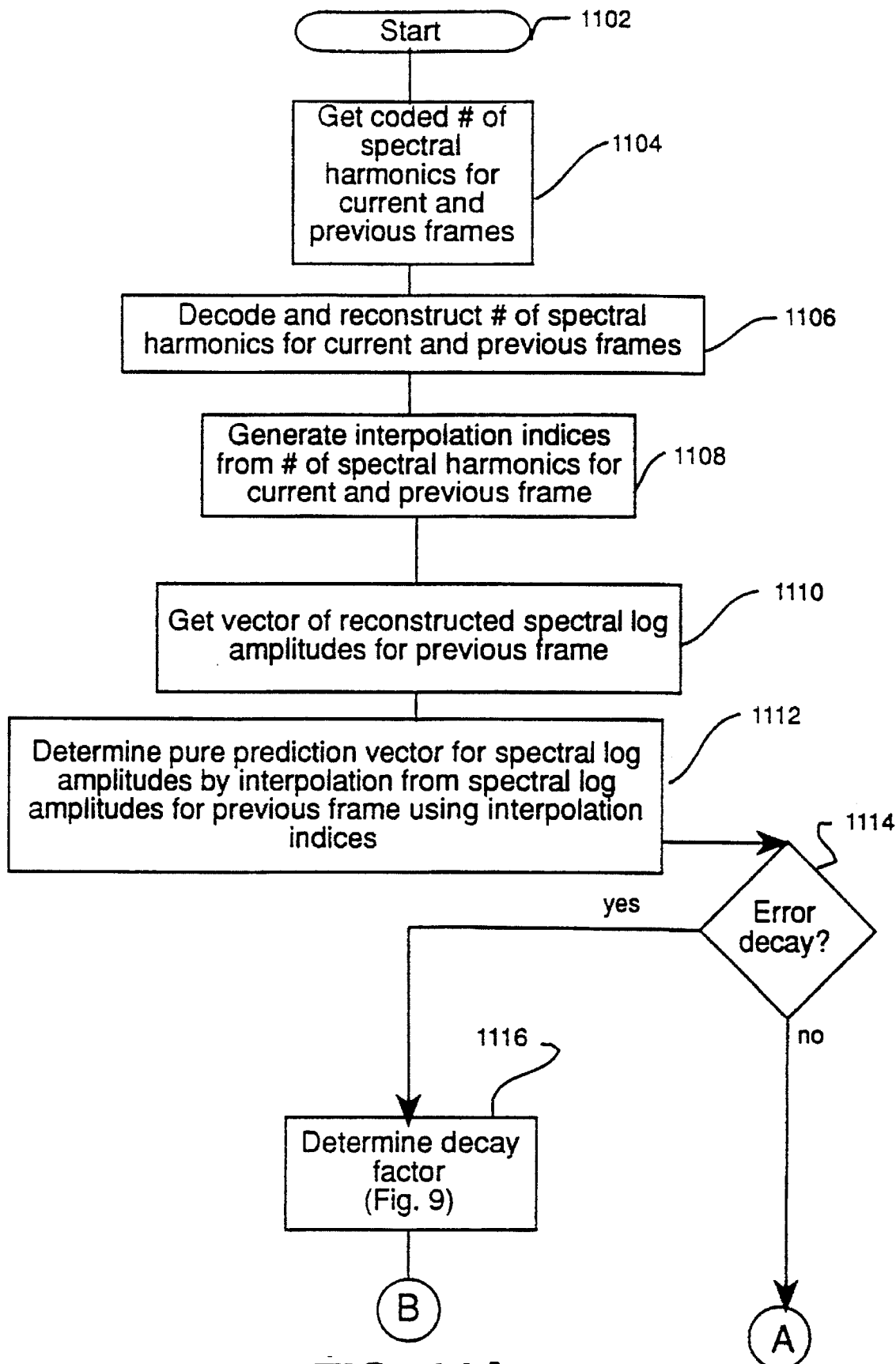
FIGS. 11A and 11B show schematically in flow chart form, the steps of a version of the method of the invention for predicting the spectral log amplitudes of the current frame.
Figure 11B:
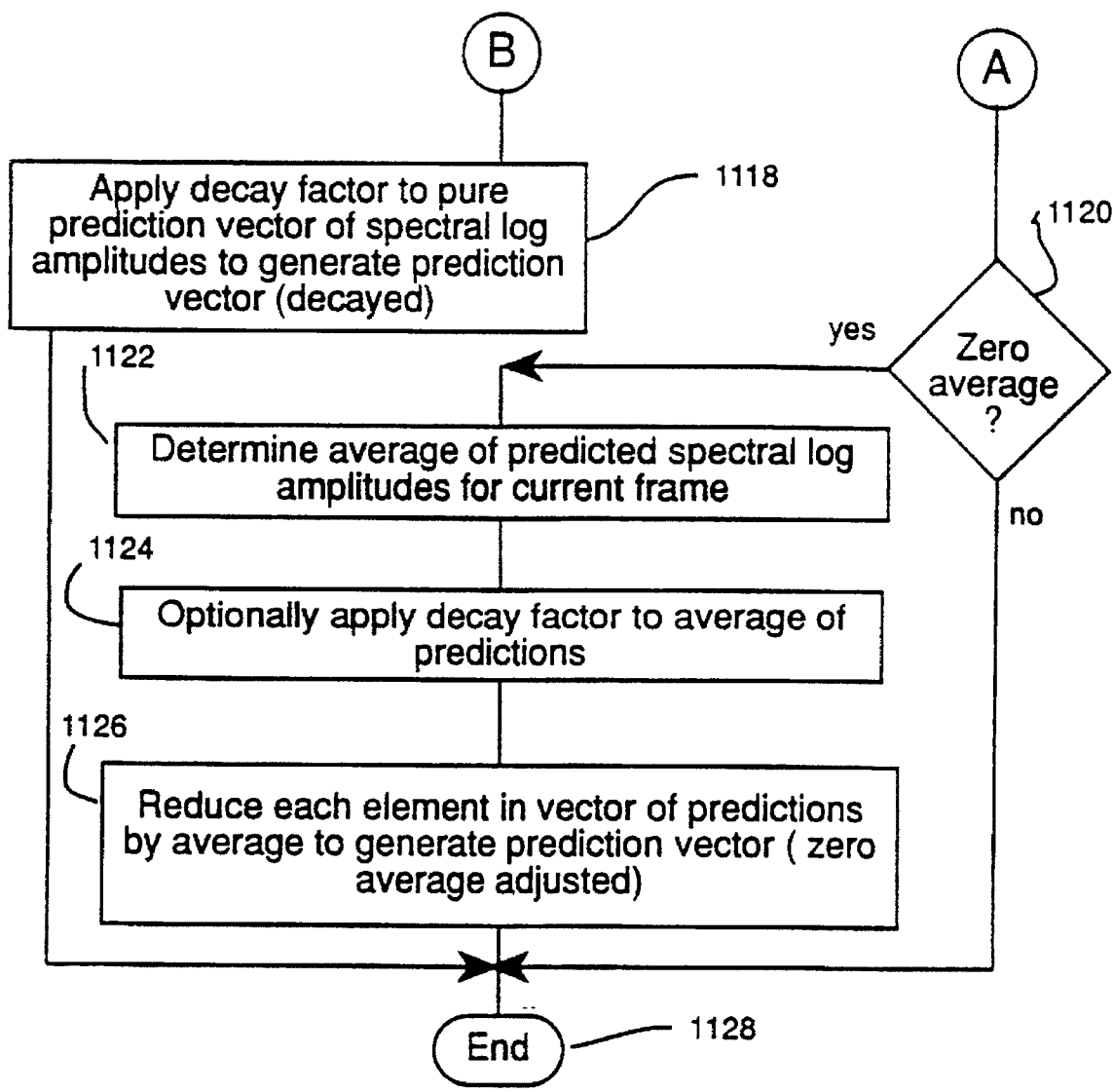

The steps of a version of the method of the invention for predicting the spectral log amplitudes are shown schematically in flow chart form in FIGS. 11A and 11B. As explained below, these steps are conducted in both the coder and the decoder. The only difference is whether the starting values have been transmitted over a channel (in the decoder) or not (in the coder). The method begins at 1102, followed by getting the fundamental frequncy $\omega(0)$ for the current frame at 1104. The number of spectral harmonics is computed at step 1106 by the decoder according to the following:

$$\tilde{L} = \left\lfloor .9254 \left\lfloor \frac{\pi}{\omega} + .25 \right\rfloor \right\rfloor . \tag{11}$$

Generating $\tilde{L}$ using Eq. (11) requires use of only the six most significant bits of $\omega$. These bits are highly protected and thus $\tilde{L}$ is highly protected. Because $\tilde{L}$ is highly protected, there is a much higher probability that $\tilde{L}$ equals $\hat{L}$, and thus there will be a much lower probability of deviation between the predicted values as generated by the decoder following the decoding steps 1302, and the anticipated predicted values as generated by the coder following the steps 1240 as it mirrors the decoding steps.

The steps that the decoder takes at 1214 will be described first, although, as mentioned above with respect to the method described in U.S. Ser. No. 624,878 (now U.S. Pat. No. 5,226,084), because of the prediction in the decoder, the coder's anticipation of that prediction, and the addition of residuals, the process is necessarily a bit recursive.

It is helpful to define at step 1108 an intermediate value as follows:

$$\tilde{k}_1 = \frac{\tilde{L}(-1)}{\tilde{L}(0)} \cdot 1. \tag{12}$$

(The value $\tilde{L}(-1)$ has been determined from the reconstruction of $\omega(-1)$ during the steps 1104 and 1106, as conducted during the prediction for the previous frame. The results have been stored in memory until needed for preparation of the current frame. If the current frame is the initial frame, then initiation defaults are used.) As in the method of U.S. Ser. No. 624,878 (now U.S. Pat. No. 5,226,084) already described, $\check{k}$ is a modified index, modified based on the ratio of harmonic amplitudes in the previous segment relative to the current segment. It is also useful to define at step 1108:

$$\delta_l \check{k}_l - \lfloor \check{k}_l \rfloor \quad (13)$$

Thus, according to the method of the invention, the predicted value for the spectral log amplitudes, $\check{M}_l$ is generated at 1112 in the decoder step 1314 according to the following:

$$\check{M}_l = \gamma \left[ \overbrace{(1-\delta_l)}^{a} \overbrace{\log_2 \tilde{M}_{\lfloor \check{k}_l \rfloor}(-1)}^{b} \overbrace{\delta_l}^{c} \overbrace{\log_2 \tilde{M}_{\lfloor \check{k}_l \rfloor+1}(-1)}^{d} \right] \quad (14)$$

As with the method disclosed in U.S. Ser. No. 624,878 (now U.S. Pat. No. 5,226,084), the b and d terms represent the log amplitudes of the spectral harmonics of the previous segment that bracket the frequency of the spectral harmonic of the current frame, selected by virtue of the floor function subscript, which is based on equations 12 and 13. (A vector containing these values has been obtained from a memory at 1110.) The a and c terms represent the weights to be given to these amplitudes, depending on their distance (along the frequency axis) from the frequency calculated to be the frequency of the $l^{th}$ harmonic. The decay factor $\gamma$ may be as above, although in another aspect of the invention, the decay factor is further enhanced, as discussed below. If no decay factor is used, the method proceeds from 1114 to the end at 1128, having established the vector of predicted spectral log amplitudes for the current frame.

Typically, a decay factor is used, and it is determined at 1116, as discussed below in connection with FIG. 9. The reconstructed spectral log amplitudes $\tilde{M}_l(0)$ are computed at 1316, generally as discussed above, by adding the predicted spectral log amplitudes to the reconstructed prediction residuals $\tilde{T}_l$, as follows:

$$\log_2 \tilde{M}_l(0) = \tilde{T}_l + \check{M}_l. \quad (15)$$

Thus, the predicted values are more accurate as compared to those predicted according to the method of U.S. Ser. No. 624,878 (now U.S. Pat. No. 5,226,084), because the parameters used to compute them are more highly protected against bit errors. Further, the predicted values are more closely mimicked, or anticipated by the mirror steps in the coder at step 1214, because the parameters upon which both coding step 1214 and decoding step 1314 are based are more likely to be equal. In order to reconstruct $\log_2 \tilde{M}_l(0)$ using equation (15), the following assumptions are always made:

$$\tilde{M}_0(-1)=1.0$$

$$\tilde{M}_l(-1)=\tilde{M}_{\tilde{L}(-1)}(-1) \text{ for } l > \tilde{L}(-1) \quad (16)$$

In addition, upon initialization, it is assumed:

$$\tilde{M}_l(-1)=1 \text{ for all } l$$

$$\tilde{L}(-1)=30 \quad (17)$$

Figure 5:
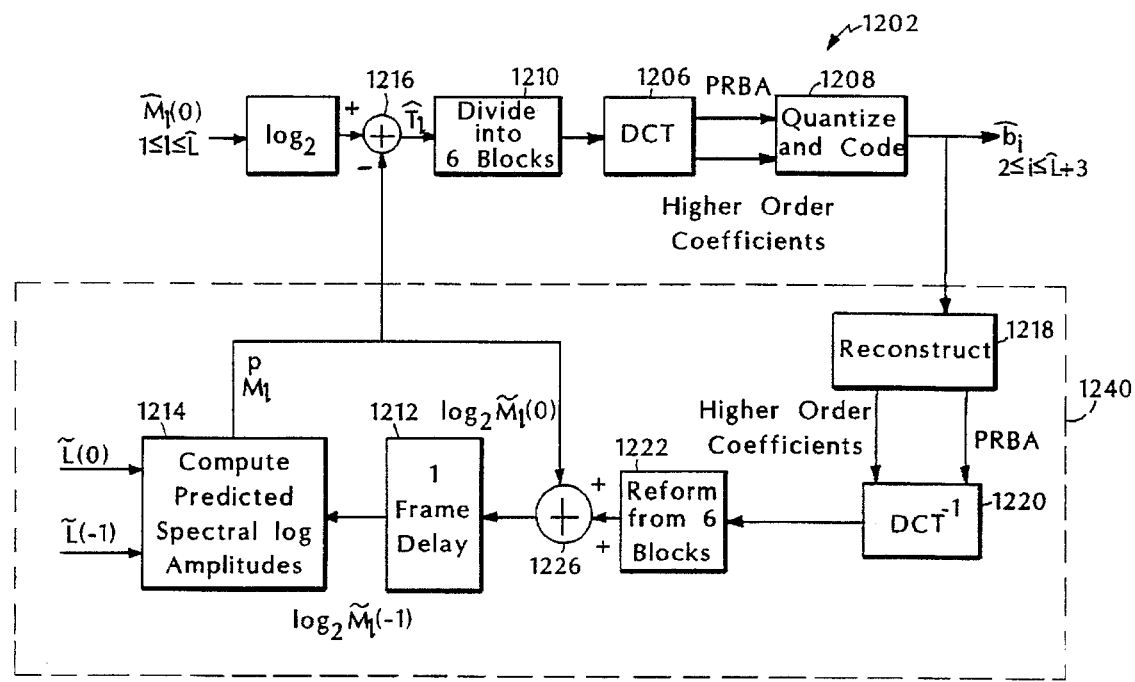
FIG. 5 is a flow chart showing the steps that are taken to encode spectral amplitudes according to a version of the method of the invention that uses prediction of spectral amplitudes in the decoder, along with the transmission of prediction residuals by the encoder, with the prediction values made on the basis of the number of spectral harmonics.
Figure 6:
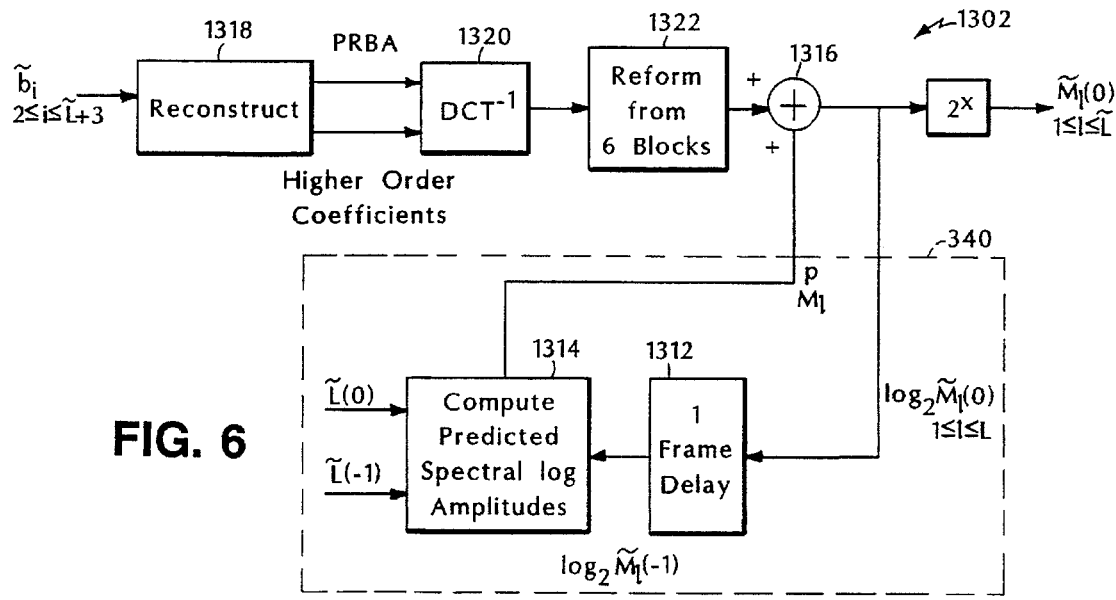
FIG. 6 is a flow chart showing the steps that are taken to decode speech encoded according to a version of the method shown in FIG. 5.
Figure 8:
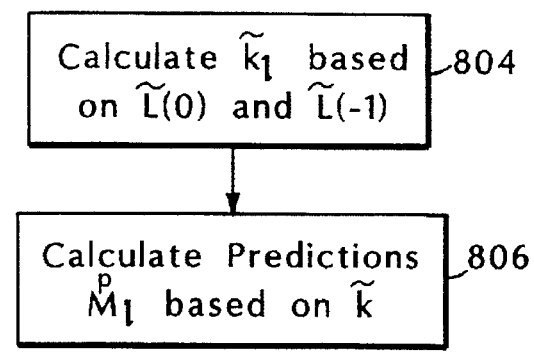
FIG. 8 is a flow chart showing schematically an overview of the steps that are taken according to a version of the method of the invention to make predictions of the spectral amplitudes of the current frame in the encoder.

As in the case of the method described in U.S. Ser. No. 624,878 (now U.S. Pat. No. 5,226,084), the coder anticipates the prediction that the decoder will make, by mirroring the steps shown in FIGS. 11A and 11B that the coder will take. As shown in FIG. 5, the coder computes the predicted spectral log amplitudes $\check{M}_l$ using as inputs $\tilde{L}(0)$ and $\tilde{L}(-1)$. The coder, at 1214 mimics all of the steps that the decoder will conduct at 1314, as shown in FIG. 8. All of the steps that the coder uses at 1214 use the reconstructed variables that should be used by the decoder. Because all such variables are ultimately based on the highly protected $\tilde{L}$, there is a high probability that the values for the parameters generated by the coding steps in the coder are the same as the values for the parameters generated by the decoding steps in the decoder. However, in the presence of a very large number of bit errors, the $\tilde{L}$ terms can differ between the coder and the decoder. Such a difference could, eventually, degrade signal quality. The same is true of the reconstructed $\tilde{M}$ terms, reconstructed in the coder and the decoder. If bit errors enter into the vector of prediction residuals, these $\tilde{M}$ terms can differ between the decoder and the coder, even though they were generated using the same equations.

In any event, at 804 (FIG. 8) (and 1108, FIG. 11A) the coder calculates $\check{k}$ and $\delta$ using equations 12 and 13 above. The coder at 806 (FIG. 8) (and 1112 FIG. 11A) calculates the predictions (that the decoder will make at 706 FIG. 7, (or 1112 FIG. 11A)) based on the $\check{k}$, as distinguished from the method described in U.S. Ser. No. 624,878 (now U.S. Pat. No. 5,226,084), which makes the predictions based on the reconstructed fundamental frequency $\omega$. The anticipation of the predicted value for the spectral log amplitudes, $\check{M}_l$ is generated in step 1214 according to equation 14, the same steps used in the decoder.

In the coder, this anticipation of the prediction will be very close to the prediction soon to be generated by the decoder, since both use the highly protected parameter k (derived from the highly protected parameters L(0) and L(-1)) to make the predictions, and the highly protected parameter k has been used for each previous prediction in the sequence of segments. At 1216, this anticipated prediction vector is subtracted from the logarithm of the actual spectral amplitudes $\hat{M}_l(0)$ to arrive at the prediction residuals $\hat{T}_l$ according to the following:

$$\hat{T}_l = \log_2 \hat{M}_l(0) - \check{M}_l. \quad (18)$$

The vector of prediction residuals is treated at 1210, 1206 and 1208 according to the method described in U.S. Ser. No. 624,878(now U.S. Pat. No. 5,226,084), i.e. it is divided into blocks, transformed by a discrete cosine transform, and quantized to result in a vector $\hat{b}_l$. This vector is transmitted to the decoder, the received version of which $\tilde{b}_l$ is treated according to the method described in U.S. Ser. No. 624,878 (now U.S. Pat. No. 5,226,084) (reconstructed at 1318, reverse transformed at 1320, and reformed from blocks at 1322) to result in the reconstructed vector of prediction residuals $\tilde{T}_l$, which is combined at 1316 with the predicted values $\check{M}_l$ generated at step 1314, as detailed in steps 704 and 706 of FIG. 7.

In order to form the prediction residuals $\hat{T}_l$ using the foregoing equations (14) and (18), the assumptions set forth above in equations (16) and (17) are made.

The foregoing describes a basic version of the method of the invention. Another aspect of the invention relates to an enhanced method of minimizing over time the effect of bit errors transmitted in the vector $\tilde{b}_l$, reconstructed into the prediction residuals $\tilde{T}_l$. This aspect of the invention relates to the decay factor, referred to as $\gamma$ in above, and is implemented in the method steps branching from decision "error decay?" 1114 in FIG. 11A. As has been mentioned, an advantage is gained from using the differential calculation of a predicted value based on previous values, because in speech, corresponding values of adjacent frames often have similar values and thus, the differential values that must be coded and transmitted fall within a smaller range than do the absolute values. With a smaller range to be coded, fewer bits can be used. The decay factor is used to protect against the perpetuation of errors, with a larger decay factor providing less protection against perpetuation of errors, but allowing for a more purely differential coding scheme, thus possibly taking better advantage of similarities in values from one frame to the next.

When there are relatively few harmonic amplitudes to be coded in a particular frame, more bits are available for coding, and it is not as important to confine the range of values to be transmitted to a small range. Thus, a less purely differential coding scheme can be used, so that the errors decay away more quickly. At the same time, more bits are used to encode the prediction residuals.

According to the present invention, these competing considerations are accomodated by having a variable decay factor similar to $\gamma$, designated $\rho$, which varies depending on the number of harmonic amplitudes $\tilde{L}(0)$. This decay factor is determined at 1116 (FIG. 11 and shown in detail in FIG. 9) used in the calculation of $\check{M}_i$ at step 1118 exactly as is $\gamma$, as follows:

$$\check{M}_i = \rho \left[ \overbrace{(1-\hat{\delta}_1)}^{a} \overbrace{\log_2 \bar{M}_{\hat{k}_1,l}(-1)}^{b} + \overbrace{\hat{\delta}_1}^{c} \overbrace{\log_2 \bar{M}_{\hat{k}_1,l+1}(-1)}^{d} \right]. \quad (19)$$

However, rather than being fixed, $\rho$ is defined as follows:

$$\rho = \begin{cases} \rho_{low} & \text{if } \tilde{L}(0) \leq \tilde{L}_{low}(0) \\ \rho_{var} & \text{if } \tilde{L}_{low}(0) \leq \tilde{L}(0) \leq \tilde{L}_{hi}(0). \\ \rho_{hi} & \text{otherwise} \end{cases} \quad (20)$$

In a preferred embodiment, the following values are used:

$$\rho_{low} = .4 \quad (21)$$
$$\rho_{hi} = .7$$
$$\tilde{L}_{low}(0) = 15$$
$$\tilde{L}_{hi}(0) = 24$$
$$\rho_{var} = x \cdot \tilde{L}(0) - y.$$

In a preferred embodiment, the variables x and y are 0.03 and 0.05, respectively. Those of ordinary skill in the art will readily understand how to choose these variables, depending on the number of bits available, the type of signal being encoded, desired efficiency and accuracy, etc.

Figure 9:
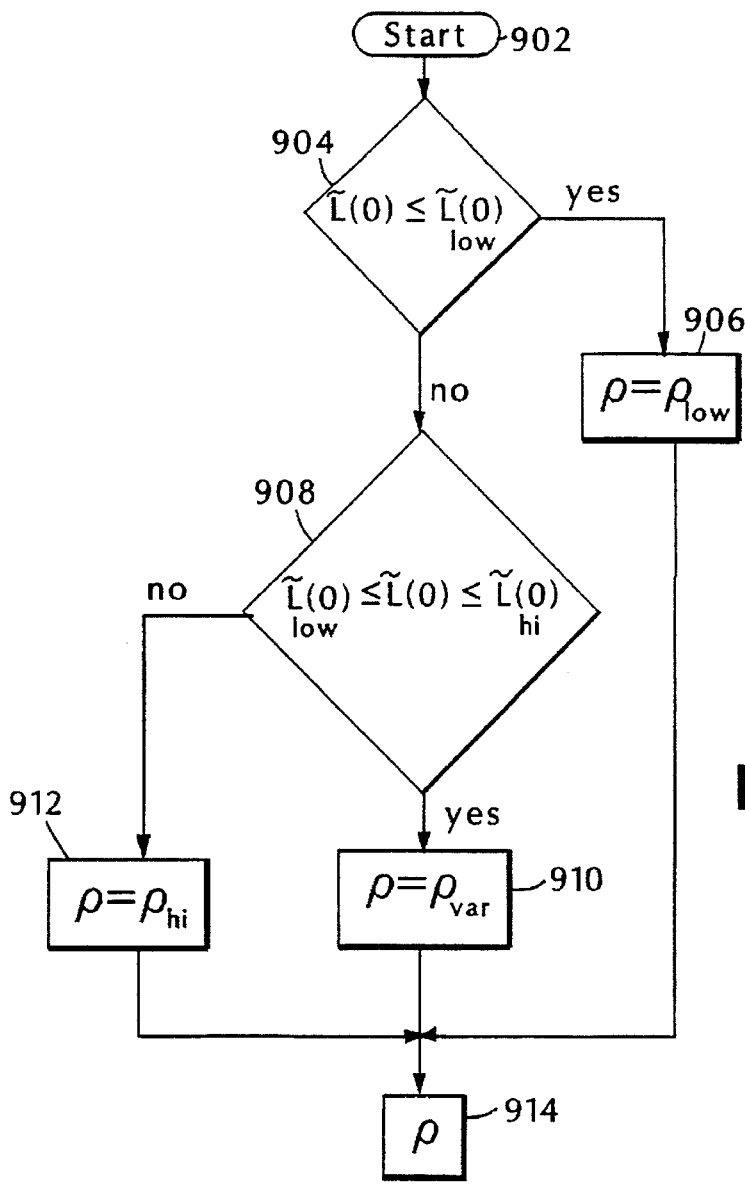
FIG. 9 is a flow chart showing schematically the steps that are taken accordingly to a version of the method of the invention to generate a variable decay factor, that depends on the amount of information that must be encoded in a frame.

The steps that implement the selection of $\rho$, embodied in equation (20), are illustrated in flow chart form in FIG. 9. (FIG. 9 shows the steps that are taken by the decoder. The same steps are taken by the coder.) The effect of such a selection of p is that for a relatively low number of spectral harmonics, i.e. $\tilde{L}(0)$ is in the low range (determined at decision step 904), the decay factor $\rho$ will be a relatively small number (established at step 906), so that any errors decay away quickly, at the expense of a less purely differential coding method. Conversely, if $\tilde{L}(0)$ is in the high range (determined at decision step 908), the decay factor is high (established at step 912), which may result in a more persistent error, but which requires fewer bits to encode the differential values. Finally, if $\tilde{L}(0)$ is in a middle range (also determined at decision step 908), the degree of protection against persistent errors varies as a function of $\tilde{L}(0)$ (established at 910). The function can be as shown, or other functions that provide the desired results can be used. Typically, the function is a nondecreasing function of $\tilde{L}(0)$.

Figure 7:
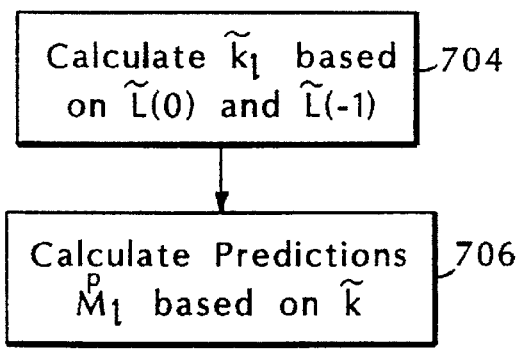
FIG. 7 is a flow chart showing schematically an overview of the steps that are taken according to a version of the method of the invention to make predictions of the spectral amplitudes of the current frame in the decoder.

The foregoing steps have described the steps taken by the decoder at 706 (FIG. 7, shown in more detail in FIGS. 11A and 11B), when it calculates the prediction values $\check{M}_i$. The corresponding steps are taken by the coder at step 806 (also shown in more detail in FIGS. 11A and 11B) when it anticipatorily calculates the prediction values $\check{M}_i$. Thus, equation (19) is used, with the variable $\rho$, rather than the fixed $\gamma$. The decay factor is calculated in the coder in the same fashion as it is calculated in the decoder, shown in FIG. 9 and explained above. Thus, for lower values of $\tilde{L}(0)$ where more bits are available, these method steps are conducted in the coder and the decoder for reducing the persistence of errors in the reconstructed spectral amplitudes caused by transmission errors.

Figure 1A:
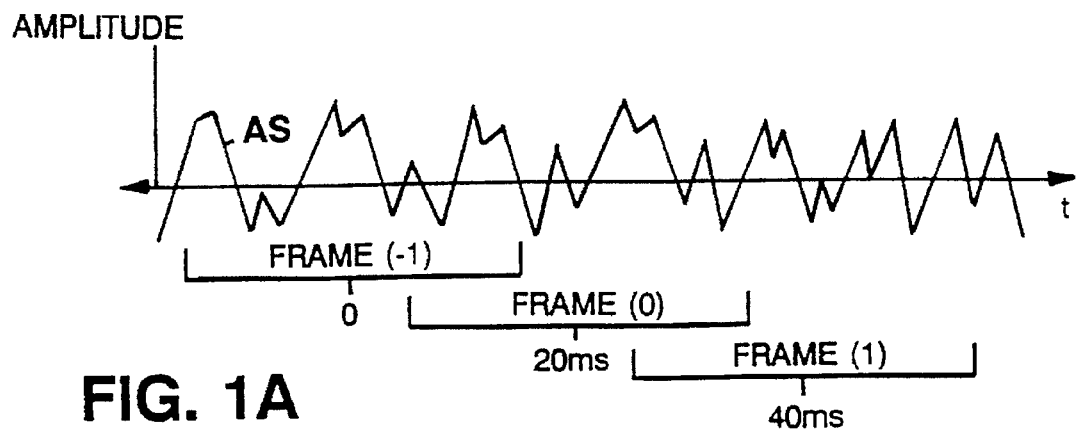
FIG. 1A is a schematic representation of an analog speech signal, showing overlapping frames.
Figure 1B:
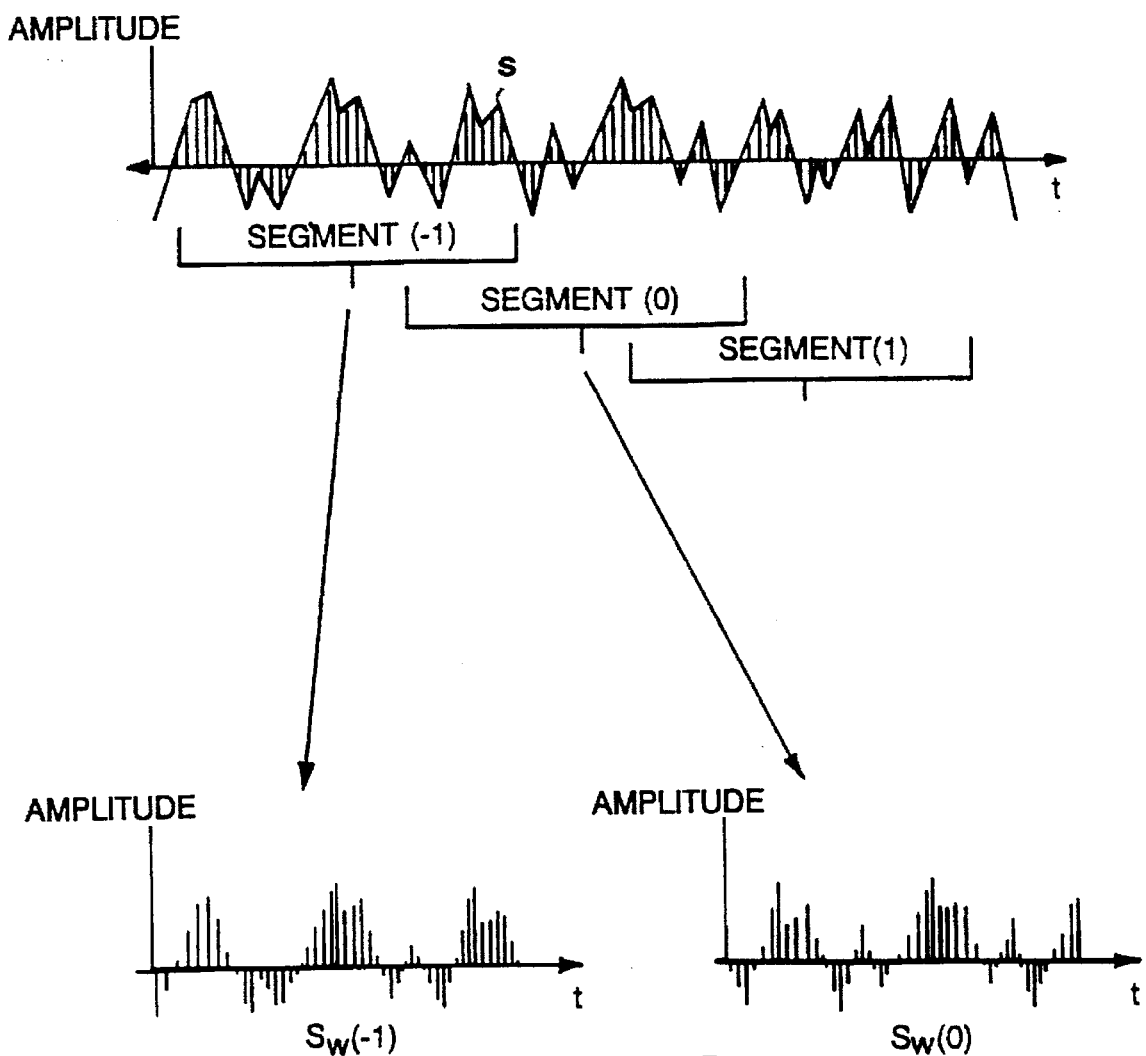
FIG. 1B is a schematic representation of two frames of sampled speech signal.
Figure 1C:
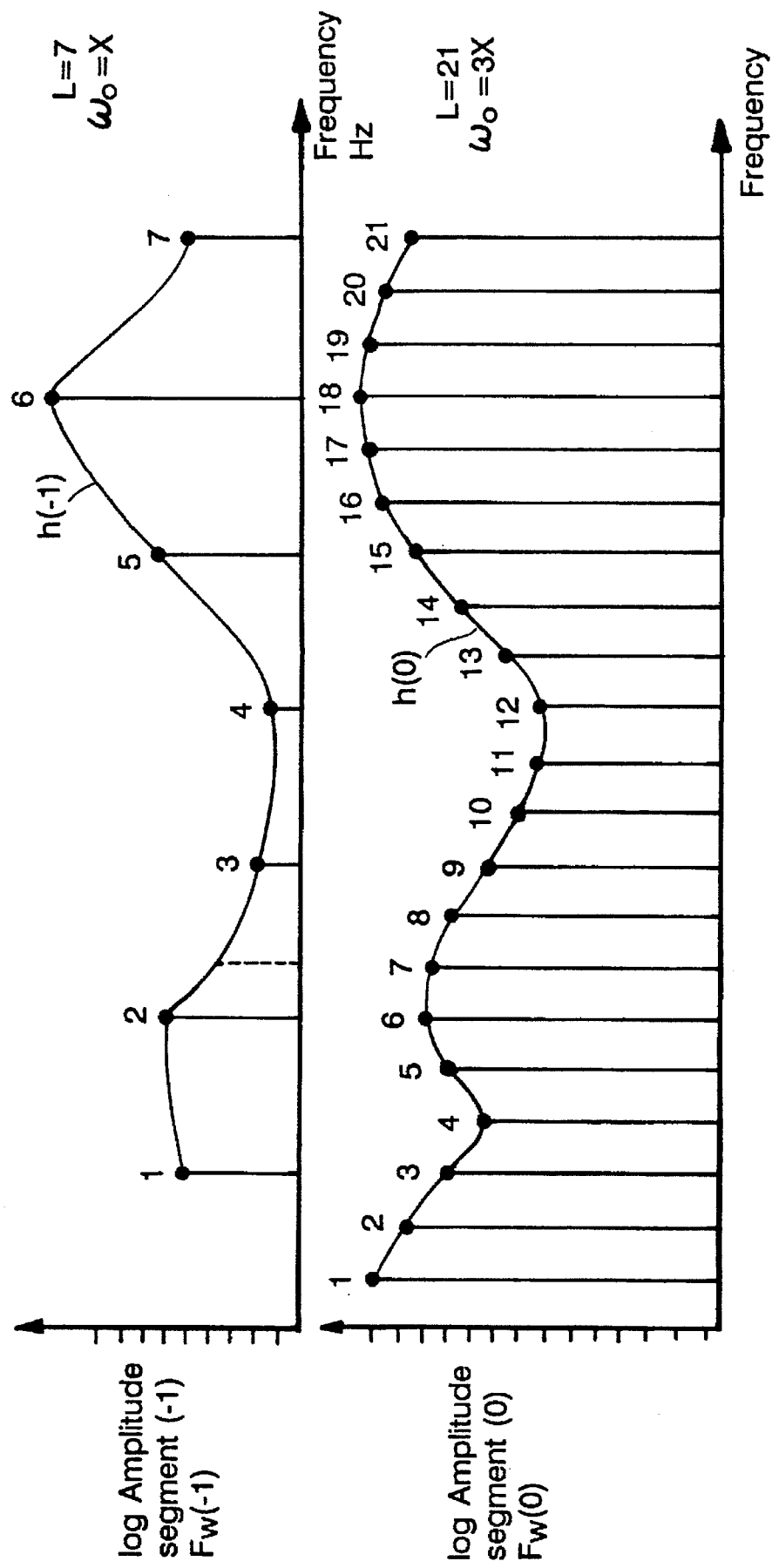
FIG. 1C is a schematic representation of the spectral amplitudes that contribute to two successive frames of sampled speech.

The method of the invention also addresses another difficulty in accurate prediction in the decoder of the spectral amplitudes. This difficulty stems from the difference in the average amplitude of the spectral amplitudes in one frame, as compared to the preceding frame. For instance, as shown in FIG. 1C, while the curve h establishing the shape of the spectral envelope is relatively similar in the current frame h(0) as compared to the preceding frame h(-1), the average amplitude in the current frame is at least twice that in the prior frame. Thus, if equation (19) is applied to generate the estimates for $\check{M}_i$, each estimate in the vector will be off by a significant amount, which is related to the average amplitude in the frame.

The invention overcomes this problem by branching at decision 1120 "zero average?" as shown in FIG. 11B. If this aspect of the invention is not implemented, the method follows from decision 1120 to end 1128, and the predicted spectral log amplitudes are not adjusted for the average amplitude. Following the "yes" decision result from decision 1120, the method of the invention establishes at 1122 the average of the interpolated spectral log amplitudes from each predicted spectral log amplitude, $\check{M}_i$ computed as above and then subtracts this average from the vector of predictions at step 1126, as follows:

$$\log_2 \bar{M}_1(0) = \tilde{T}_1 + \check{M}_1 - \quad (22)$$

$$\frac{\rho}{\tilde{L}(0)} \sum_{\lambda=1}^{\tilde{L}(0)} \overbrace{(1-\hat{\delta}_\lambda)}^{a} \overbrace{\log_2 \bar{M}_{\hat{k}_\lambda,l}(-1)}^{b} + \overbrace{\hat{\delta}_\lambda}^{c} \overbrace{\log_2 \bar{M}_{\hat{k}_\lambda,l+1}(-1)}^{d}.$$

Thus, for each reconstruction of the spectral amplitude, a factor is subtracted from the prediction, which factor is the average of all of the predicted amplitudes, as based on the previous frame. Addition of this factor to the predicted spectral amplitude results in a zero mean predicted value. The result at 1128 is that the average amplitude of any previous frame does not figure into the estimation of any current frame. This happens in both the decoder and the coder. For instance, in the coder, at step 806, the coder generates the prediction residuals, $\hat{T}_1$ according to the following corresponding equation:

$$\hat{T}_I = \log_2 \hat{M}_I(0) = -\check{M}_1 + \quad (23)$$

-continued $$\frac{p}{\hat{L}(0)} \sum_{\lambda=1}^{\hat{L}(0)} \overbrace{(1-\hat{\delta}_\lambda)}^{a} \overbrace{\log_2 \hat{M}_{\hat{k}_\lambda}(-1)}^{b} + \overbrace{\hat{\delta}_\lambda}^{c} \overbrace{\log_2 \hat{M}_{\hat{k}_\lambda+1}(-1)}^{d}.$$

Thus, when the coder generates the prediction residuals, it first subtracts from the actual values the full predicted values, based on the previous values, then adds to each the average value of $\hat{M}_t$ (which can be different from the average value of the entire preceding frame). Consequently, the result of any error in the prediction in the previous frame of the average value is eliminated. This effectively eliminates differential coding of the average value. This has been found to produce little or no decrease in the coding efficiency for this term, while reducing the persistance of bit errors in this term to one frame.

If the aspect of the invention using a decay factor is implemented, it is appropriate at 1124 to apply the decay factor to the average of the predicted spectral log amplitudes before reducing the predictions by the average.

Variations on the foregoing method that take advantage of the benefits of the invention will be appreciated by those of ordinary skill in the art. The three enhancements discussed can be used together, alone, or in any combination, depending on the needs of the particular system. The error protection scheme is not critical to the invention, as long as all of the bits used to generated the indices used in the prediction interpolation are protected against bit errors. The means by which the variation in the decay factor are established can be altered, as long as the variation in some way depend on the amount of information that must be coded in each segment, such as the number of spectral harmonics, or the fundamental frequency. Typically, any function of the number of spectral harmonics having at lest one domain interval that is an increasing function of the number of spectral harmonics is within the contemplation of the invention. The means by which the average amplitude of the frame is accounted for can be varied, as long as it is in fact accounted for. The manipulations regarding the decay factor and the average amplitude need not be conducted in the logarithm domain, and can, rather, be performed in the amplitude domain or any other domain which provides the equivalent access.

An implementation of the invention is part of the APCO/NASTD/Fed Project 25 vocoder, standardized in 1992.

The foregoing discussion should be understood as illustrative and should not be considered to be limiting in any sense. While this invention has been particularly shown and described with references to preferred embodiments thereof, it will be understood by those skilled in the art that various changes in form and details may be made therein without departing from the spirit and scope of the invention as defined by the claims.

Having described the invention, what is claimed is:

1. A method for predicting speech signal parameters for use in encoding or decoding speech, comprising:
   representing segments of a speech signal by frames of a data signal that each comprise a fundamental frequency and multiple spectral harmonics;
   reconstructing speech signal parameters that characterize a first segment of speech from a first frame;
   reconstructing a first control parameter that characterizes the first segment using a first digitally encoded signal, wherein all digital bits of the first digitally encoded signal that represent the first control parameter are protected by an error protection code;
   reconstructing a second control parameter that characterizes a second segment of speech from a second frame using a second digitally encoded signal, wherein all digital bits of the second digitally encoded signal that represent the second control parameter are protected by an error protection code; and
   predicting speech signal parameters that characterize the second segment based on the reconstructed speech signal parameters and the first and second control parameters.

2. The method of claim 1, wherein the reconstructed and predicted speech signal parameters comprise spectral amplitudes.

3. The method of claim 1, wherein the first and second control parameters comprise the fundamental frequencies of, respectively, the first and second frames.

4. The method of claim 1, wherein the first and second control parameters comprise the number of spectral amplitudes for, respectively, the first and second frames.

5. The method of claim 4, wherein the first and second control parameters are each encoded using six digital bits.

6. The method of claim 1, further comprising:
   computing a scale factor from the first and second control parameters, and
   applying the scale factor to the predicted speech signal parameters to produce modified predicted speech signal parameters.

7. The method of claim 6, wherein the reconstructed and predicted speech signal parameters comprise spectral amplitudes.

8. The method of claim 6, wherein applying the scale factor comprises:
   taking a logarithm of the spectral amplitudes to produce log spectral amplitudes, and
   multiplying the log spectral amplitudes by the scale factor to produce the modified predicted speech signal parameters.

9. The method of claim 6, wherein the first and second control parameters comprise the number of spectral amplitudes for, respectively, the first and second frames.

10. The method of claim 9, wherein the scale factor comprises an increasing function of the number of harmonics over at least one domain interval.

11. The method of claim 1, further comprising removing the mean value of the predicted speech signal parameters from the predicted speech signal parameters to produce modified predicted speech signal parameters.

12. A method for predicting speech signal parameters for use in encoding or decoding speech, comprising:
   representing segments of a speech signal by frames of a data signal that each comprise a fundamental frequency and multiple spectral harmonics;
   reconstructing speech signal parameters that characterize a first segment of speech from a first frame;
   reconstructing a first control parameter that characterizes the first segment;
   reconstructing a second control parameter that characterizes a second segment of speech from a second frame;
   predicting speech signal parameters that characterize the second segment based on the reconstructed speech signal parameters and the first and second control parameters;
   computing a scale factor from the first and second control parameters; and
   applying the scale factor to the predicted speech signal parameters to produce modified predicted speech signal parameters.

13. The method of claim 12, wherein the reconstructed and predicted speech signal parameters comprise spectral amplitudes.

14. The method of claim 12, wherein applying the scale factor comprises:

taking a logarithm of the spectral amplitudes to produce log spectral amplitudes, and multiplying the log spectral amplitudes by the scale factor to produce the modified predicted speech signal parameters.

15. The method of claim 12, wherein the first and second control parameters comprise the number of spectral amplitudes for, respectively, the first and second frames.

16. The method of claim 15, wherein the scale factor comprises an increasing function of the number of harmonics over at least one domain interval.

17. A method for predicting speech signal parameters for use in encoding or decoding speech, comprising:

representing segments of a speech signal by frames of a data signal that each comprise a fundamental frequency and multiple spectral harmonics;

reconstructing speech signal parameters that characterize a first segment of speech from a first frame;

reconstructing a first control parameter that characterizes the first segment;

reconstructing a second control parameter that characterizes a second segment of speech from a second frame;

predicting speech signal parameters that characterize the second segment based on the reconstructed speech signal parameters and the first and second control parameters; and removing the mean value of the predicted speech signal parameters from the predicted speech signal parameters to produce modified predicted speech signal parameters.

* * * * *

UNITED STATES PATENT AND TRADEMARK OFFICE
CERTIFICATE OF CORRECTION

PATENT NO. : 5,630,011

DATED : May 13, 1997

INVENTOR(S) : Jae S. Lim and John C. Hardwick

It is certified that error appears in the above-identified patent and that said Letters Patent is hereby corrected as shown below:

Cover page, column 2, [56] References Cited, OTHER PUBLICATIONS, the "Griffen et al." reference, "Griffen et al." should be --Griffin et al.--.

Cover page, column 2, [56] References Cited, OTHER PUBLICATIONS, the first "Almeida et al." reference, "1746-7/82/000" should be --1746-7/82/0000--.

Cover page, column 2, [56] References Cited, OTHER PUBLICATIONS, the second "Almeida et al." reference, "Suynthesis" should be --Synthesis--.

Column 3, line 32, before "parameters" insert -- ~ --.

Column 4, line 32, "$\omega$" should be --"$\tilde{\omega}$"--.

Column 5, line 9, "distiguish" should be --distinguish--.

Column 5, line 46, "$\omega(-1)$" should be --"$\tilde{\omega}(-1)$"--.

Column 5, line 47, "$\omega(0)$" should be --"$\tilde{\omega}(0)$"--.

Column 6, line 25, "$\omega(0)$" should be --"$\tilde{\omega}(0)$"--.

Column 6, line 25, "$\omega(-1)$" should be --"$\tilde{\omega}(-1)$"--.

Column 7, equation (4), line 2, "$\tilde{M}^*_L(-1)$" should be --$\tilde{M}^*_{L(-1)}(-1)$--.

UNITED STATES PATENT AND TRADEMARK OFFICE
CERTIFICATE OF CORRECTION

PATENT NO. : 5,630,011

DATED : May 13, 1997

INVENTOR(S) : Jae S. Lim and John C. Hardwick

It is certified that error appears in the above-identified patent and that said Letters Patent is hereby corrected as shown below:

Column 8, line 65, after "U.S. Ser. No. 624,878" insert --(now U.S. Pat. No. 5,226,084)--.

Column 11, lines 48 and 50, "$\omega$" should be --"$\tilde{\omega}$"--.

Column 11, line 58, "desireable" should be --desirable--.

Column 12, line 37, "undesireable" should be --undesirable--.

Column 14, line 59, "$\hat{M}(0)$" should be --$\hat{M}_1(0)$--.

Column 15, line 52, "$\omega(0)$" should be --"$\tilde{\omega}(0)$"--.

Column 15, line 52, "$\omega(-1)$" should be --"$\tilde{\omega}(-1)$"--.

Column 16, lines 6-8, delete "the co-filed application identified above, in the names of the inventors hereof, filed of even date hereof" and insert --U.S. Ser. No. 07/983,397, filed on November 30, 1992--.

Column 16, line 9, after "Channel" insert --,--.

Column 16, line 13, after "are" insert --a--.

Column 16, line 16, "$\hat{L}(0)$" should be --$\tilde{L}(0)$--.

Column 16, line 21, "generated" should be --generate--.

Column 16, line 33, "$\omega(0)$" should be --"$\tilde{\omega}(0)$"--.

Column 16, line 41, "$\omega$" should be --"$\tilde{\omega}$"--.

UNITED STATES PATENT AND TRADEMARK OFFICE
CERTIFICATE OF CORRECTION

PATENT NO.   : 5,630,011

DATED        : May 13, 1997

INVENTOR(S)  : Jae S. Lim and John C. Hardwick

It is certified that error appears in the above-identified patent and that said Letters Patent is hereby corrected as shown below:

Column 16, line 62, "$\omega(-1)$" should be --"$\tilde{\omega}(-1)$".

Column 17, equation (13), "$\delta$" should be --$\tilde{\delta}$--, and "$\rceil\lceil$" should be --$\lfloor\rfloor$--.

Column 17, equation (14), between set "b" and set "c" insert --+--.

Column 18, line 3, after "reconstructed" insert -- ~ --.

Column 18, line 18, "$\delta$" should be --$\tilde{\delta}$--.

Column 18, line 19, after "11A" insert --)--.

Column 18, line 21, after "11A)" delete --)--.

Column 18, line 24, "$\omega$" should be --"$\tilde{\omega}$"--.

Column 19, line 54, "p" should be --$\rho$--.

Column 21, line 26, "generated" should be --generate--.

Column 21, line 33, "lest" should be --least--.

Signed and Sealed this

Twelfth Day of May, 1998

*Attest:*

BRUCE LEHMAN

*Attesting Officer*   Commissioner of Patents and Trademarks